(12) United States Patent  
Umegami et al.

(10) Patent No.: US 12,652,044 B2  
(45) Date of Patent: Jun. 9, 2026

(54) DRIVING CIRCUIT AND CONTROL BOARD

(71) Applicant: ROHM CO., LTD., Kyoto (JP)

(72) Inventors: Hirokatsu Umegami, Kyoto (JP);  
Atsushi Yamaguchi, Kyoto (JP);  
Manabu Ishitobi, Yamatokoriyama (JP)

(73) Assignee: ROHM CO., LTD., Kyoto (JP)

( * ) Notice: Subject to any disclaimer, the term of this patent is extended or adjusted under 35 U.S.C. 154(b) by 812 days.

(21) Appl. No.: 18/006,327

(22) PCT Filed: Jul. 21, 2021

(86) PCT No.: PCT/JP2021/027294  
§ 371 (c)(1),  
(2) Date: Jan. 20, 2023

(87) PCT Pub. No.: WO2022/024915  
PCT Pub. Date: Feb. 3, 2022

(65) Prior Publication Data  
US 2023/0290568 A1 Sep. 14, 2023

(30) Foreign Application Priority Data

Jul. 30, 2020 (JP) ................................ 2020-128885

(51) Int. Cl.  
*H03K 17/691* (2006.01)  
*H01F 27/28* (2006.01)  
(Continued)

(52) U.S. Cl.  
CPC ....... *H03K 17/691* (2013.01); *H01F 27/2804* (2013.01); *H01F 27/292* (2013.01);  
(Continued)

(58) Field of Classification Search  
CPC . H03K 17/691; H01F 27/2804; H01F 27/292; H01F 30/16; H02M 1/08  
See application file for complete search history.

(56) References Cited

U.S. PATENT DOCUMENTS

| | | | |
|---|---|---|---|
| 5,945,902 A | 8/1999 | Lipkes et al. | |
| 9,035,422 B2* | 5/2015 | Khanolkar | H01F 27/2804 |
| | | | 257/531 |

(Continued)

FOREIGN PATENT DOCUMENTS

| | | |
|---|---|---|
| DE | 102 35 052 C1 | 12/2003 |
| DE | 10 2013 208 911 A1 | 11/2014 |

(Continued)

OTHER PUBLICATIONS

International Search Report issued in PCT/JP2021/027294, Oct. 5, 2021 (2 pages).

(Continued)

*Primary Examiner* — Jue Zhang  
(74) *Attorney, Agent, or Firm* — HSML P.C.

(57) ABSTRACT

A driving circuit controls driving of a switching element by outputting a driving signal to the switching element. The driving circuit includes an air-core transformer having a plurality of primary windings and a secondary winding magnetically coupled to each of the plurality of primary windings. An AC signal is input to each of the plurality of primary windings of the air-core transformer. The plurality of primary windings includes a first primary winding and a second primary winding. There is a phase difference between an AC signal input to the first primary winding and an AC signal input the second primary winding.

19 Claims, 23 Drawing Sheets

(51) Int. Cl.
    H01F 27/29       (2006.01)
    H01F 30/16       (2006.01)
    H02M 1/08       (2006.01)

(52) U.S. Cl.
    CPC .............. H01F 30/16 (2013.01); H02M 1/08
        (2013.01); *H01F 2027/2809* (2013.01)

(56)          References Cited

U.S. PATENT DOCUMENTS

2009/0230938 A1*  9/2009  Sakurai ................. H02M 7/538
                                    323/283
2010/0072971 A1*  3/2010  Nuebling ................ H02M 1/08
                                    323/299

FOREIGN PATENT DOCUMENTS

JP       2014-155412  A     8/2014
WO     2012/129367  A1   9/2012

OTHER PUBLICATIONS

Office Action received in the corresponding German Patent application, Aug. 3, 2023, and machine translation (24 pages).

* cited by examiner

DRIVING CIRCUIT AND CONTROL BOARD

TECHNICAL FIELD

The present disclosure relates to a driving circuit and a control board.

BACKGROUND ART

As a motor control device or a power supply device, there are the ones which carry a switching element such as a MOSFET (Metal Oxide Semiconductor Field Effect Transistor) and an IGBT (Insulated Gate Bipolar Transistor). On such a motor control device and a power supply device, a driving circuit is utilized in order to control driving of the switching element (switching operation). For example, Patent Document 1 discloses a driving circuit utilized for a motor driving device.

PRIOR ART DOCUMENT

Patent Document

Patent Document 1: JP-A-2014-155412

SUMMARY OF THE INVENTION

Problem to be Solved by the Invention

According to a motor control device and a power supply device that have a switching element, various kinds of switching operations can be assumed as being required regarding the switching element.

The present disclosure has been conceived in view of the circumstances described above, and an objective thereof is to provide a driving circuit which can adjust a switching operation of a switching element as an object to be driven with a high degree of freedom.

Means for Solving the Problems

A driving circuit according to the first aspect of the present disclosure controls driving of a switching element by outputting a driving signal to the switching element. The driving circuit includes an air-core transformer having a plurality of primary windings and a secondary winding magnetically coupled to each of the plurality of primary windings. An AC signal is input to each of the plurality of primary windings of the air-core transformer. The plurality of primary windings include a first primary winding and a second primary winding. There is a phase difference between an AC signal input to the first primary winding and an AC signal input the second primary winding.

A control board according to the second aspect of the present disclosure includes the driving circuit according to the first aspect of the present disclosure. The control board includes a wiring substrate carrying the air-core transformer inside. The wiring substrate includes a plurality of wiring layers laminated in a thickness direction, and a plurality of insulating layers interposed between the plurality of wiring layers in the thickness direction. The air-core transformer is configured by a wiring pattern in the plurality of wiring layers.

Advantages of the Invention

According to the driving circuit and the control board of the present disclosure, the switching operation of the switching element as the object to be driven can be adjusted with a high degree of freedom.

MODE FOR CARRYING OUT THE INVENTION

Preferred embodiments of a driving circuit and a control board of the present disclosure are described below with reference to the accompanying drawings. In the descriptions below, the same reference symbols are given for the same or similar constituent substances, and a redundant explanation is omitted.

<Driving Circuit>

Figure 1:
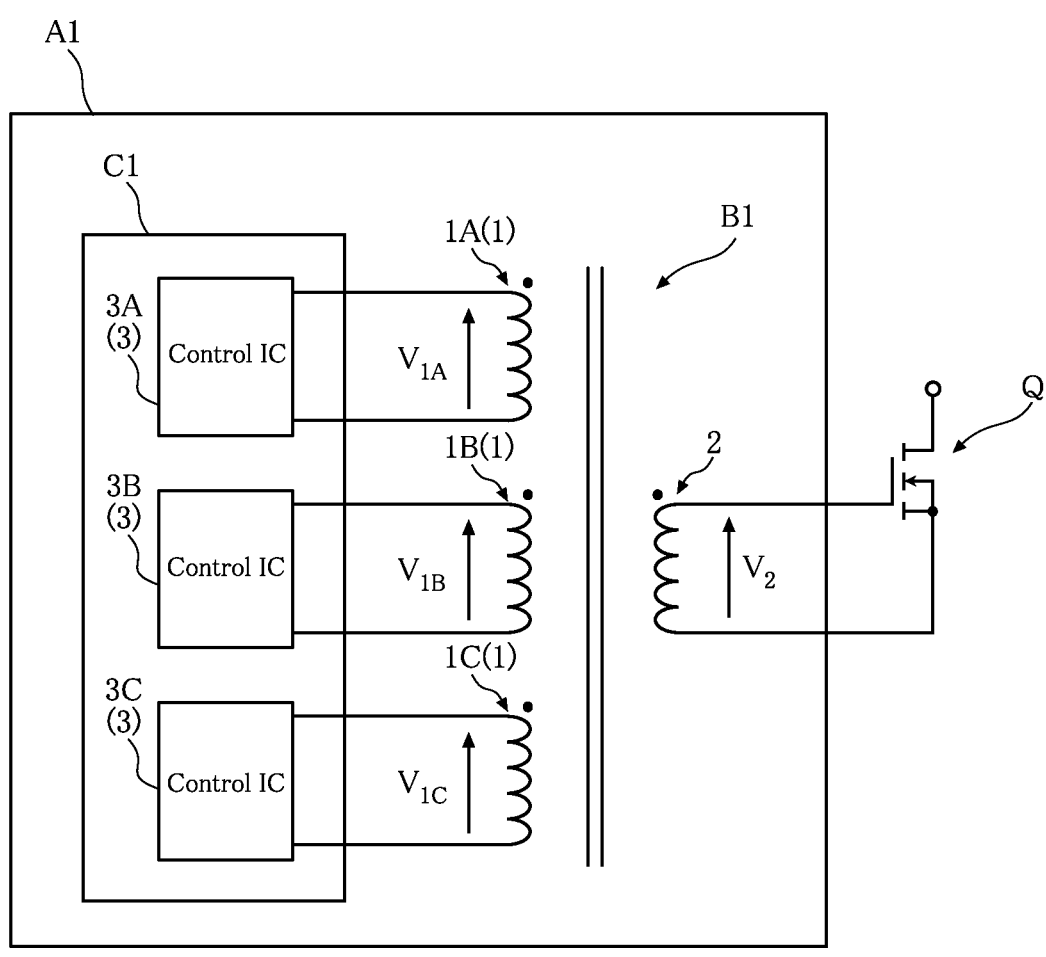
FIG. 1 is a circuit diagram illustrating an example of a circuit configuration of a driving circuit of the present disclosure.

To begin with, a driving circuit A1 of the present disclosure is described with reference to FIG. 1. FIG. 1 is a circuit diagram illustrating an example of a circuit configuration of the driving circuit A1. As shown in FIG. 1, the driving circuit A1 is provided with an air-core transmitter B1 and a control part C1.

The driving circuit A1 controls driving of a switching element Q by outputting a driving signal to the switching element Q. The switching element Q is a MOSFET, for example. In this configuration, the driving circuit A1 is what is called a gate driver, and the driving signal is a voltage signal. The switching element Q is not limited to the MOSFET, and can be another transistor such as an IGBT.

The air-core transmitter B1 has a plurality of primary windings 1 and secondary winding 2 as shown in FIG. 1. Each of the primary windings 1 and the secondary winding 2 are magnetically coupled to each other. In FIG. 1, two straight lines illustrated between the respective primary windings 1 and the secondary winding 2 show magnetic coupling and do not indicate a core member such as a magnetic substance. Regarding the present embodiment, we describe the case where the air-core transmitter B1 has three primary windings 1 as an example, but it is sufficient that the air-core transmitter has two or more primary windings 1. If the three primary windings 1 are to be distinguished from one another, they are referred to as a primary winding 1A, a primary winding 1B, and a primary winding 1C.

To each of the plurality of primary windings 1 an AC signal is input from the control part C1. To each primary winding 1 an AC voltage is input as the AC signal from the control part C1, for example. An AC current according to the input AC voltage runs in each primary winding 1, and a magnetic field is generated by the AC current. The AC voltage input to each primary winding 1 is a rectangular wave, and its cycle (frequency), amplitude (maximum value), ratio between a period to have a positive value and a period to have a negative value within one whole cycle, and phase are adjusted as appropriate. In one example, the AC voltages input to the plurality of primary windings 1 respectively have the same cycle (frequency) and amplitude (maximum value), and the ratio of the period to have a positive voltage value and the period to have a negative voltage value in one whole cycle is 50:50 and they are the same to each other. Further, if it is assumed that the number of the primary windings is n (n is a natural number), the phases of the signals are different from one another by $2\pi/n$.

The numbers of turns of the plurality of primary windings 1 are not specifically limited, but take the same value in the present embodiment. That is, if the number of turns of the primary winding 1A is $N_{1A}$, the number of turns of the primary winding 1B is $N_{1B}$, and the number of turns of the primary winding 1C is $N_{1C}$, $N_{1A}:N_{1B}:N_{1C}=1:1:1$.

The secondary winding 2 is magnetically coupled to the respective primary windings 1, as explained above. The induction current runs in the secondary winding 2 due to the magnetic fields generated by the respective primary windings 1, and the secondary winding 2 outputs the voltage according to the induction current (hereinafter referred to as the "output voltage"). In the present embodiment, the output voltage output from the secondary winding 2 is input to the switching element Q as the above driving signal.

The number of turns of the secondary winding 2 is not specifically limited, but is the same as those of the plurality of primary windings 1 in the present embodiment. That is, if the number of turns of the secondary winding 2 is $N_2$, $N_{1A}:N_{1B}:N_{1C}:N_2=1:1:1:1$.

The control part C1 generates an AC signal to be input to each primary winding 1 of the air-core transformer B1. The control part C1 includes a plurality of control ICs 3 as shown in FIG. 1. The plurality of control ICs 3 respectively generates an AC signal (e.g., an AC voltage) with respect to each primary winding 1, and outputs it to each primary winding 1. In the present embodiment, the control part C1 includes one control IC 3 for each of the plurality of primary windings 1. Thus, in the example where the air-core transformer B1 has three primary windings 1, the control part C1 has three control ICs 3 as shown in FIG. 1. If those three control ICs are to be distinguished from one another, they are referred to as a control IC 3A, a control IC 3B, and a control IC 3C. The control IC 3A inputs an AC signal (an AC voltage) to the primary winding 1A. The control IC 3B inputs an AC signal (an AC voltage) to the primary winding 1B. The control IC 3C inputs an AC signal (an AC voltage) to the primary winding 1C. In another embodiment, the control part C1 may be configured to include a common IC 3 for the plurality of primary windings 1. In this case, this common control IC 3 inputs an AC signal (an AC voltage) to the respective primary windings 1.

<Operation Example of the Driving Circuit>

Next, an operation example of the driving circuit A1 is explained with reference to FIG. 2.

Figure 2:
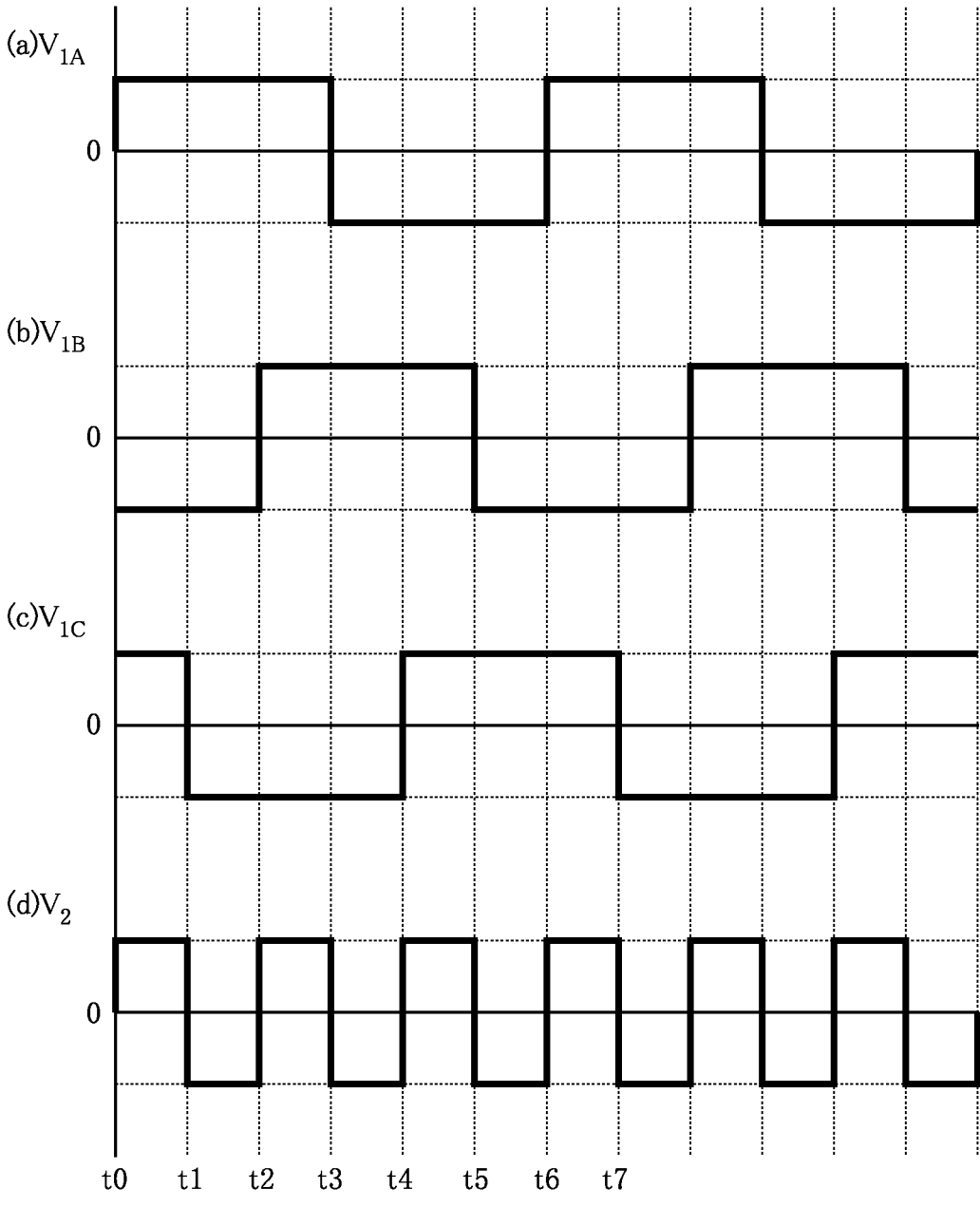
FIG. 2 is a time chart illustrating an operation example of the driving circuit of the present disclosure.

FIG. 2 is a time chart illustrating an operation example of the driving circuit A1. FIG. 2A illustrates a waveform of an AC voltage $V_{1A}$ (an AC signal) input to the primary winding 1A of the air-core transformer B1. FIG. 2B illustrates a waveform of an AC voltage $V_{1B}$ (an AC signal) input to the primary winding 1B of the air-core transformer B1. FIG. 2C illustrates a waveform of an AC voltage Vic (an AC signal) input to the primary winding 1C of the air-core transformer B1. FIG. 2D illustrates a waveform of an AC voltage $V_2$ (an AC signal) input to the secondary winding 2 of the air-core transformer B1. Note that for ease of understanding, in FIG. 2, the longitudinal axis and the transverse axis of the time chart is scaled up or down as appropriate, and the respective waveforms that are shown are simplified, or exaggerated or emphasized.

In the operation example illustrated in FIG. 2, for example, the three AC voltages $V_{1A}$, $V_{1B}$, and $V_{1C}$ illustrated in FIGS. 2A-2C are input to the respective primary windings 1A-1C. As illustrated in FIGS. 2A-2C, the three AC voltages $V_{1A}$, $V_{1B}$, and $V_{1C}$ are rectangular waves, respectively. Further, the three AC voltages $V_{1A}$, $V_{1B}$, and $V_{1C}$ are the same with one another in the cycle (frequency) and the amplitude (maximum value), and the ratio of the period to have a positive voltage value and the period to have a negative voltage value in one whole cycle is 50:50 and they are the same to each other. Further, the phases of the three AC voltages $V_{1A}$, $V_{1B}$, and $V_{1C}$ are different from one another by about 120 degrees ($=2\pi/3$). When such AC voltages $V_{1A}$, $V_{1B}$, and $V_{1C}$ are input to the respective primary windings 1A, 1B, and 1C, the currents according to those AC voltages $V_{1A}$, $V_{1B}$, and $V_{1C}$ flow therein, and a magnetic field is generated by each of the plurality of primary windings 1A, 1B, and 1C. Note that the magnitudes of the magnetic fluxes generated from the respective primary windings 1A, 1B, and 1C are roughly proportional to the amplitudes (maximum values) of the respective AC voltages $V_{1A}$, $V_{1B}$, and $V_{1C}$. Further, due to the influences of the magnetic fields generated by the respective primary windings 1A, 1B, and 1C, an induction current flows in the secondary winding 2, and the output voltage $V_2$ illustrated in FIG. 2D is output from the secondary winding 2. This output voltage $V_2$ is a voltage in accordance with the induction current.

For example, between time t0 and time t1, the AC voltage $V_{1A}$ input to the primary winding 1A and the AC voltage $V_{1C}$ input to the primary winding 1C respectively take a positive value, and the AC voltage $V_{1B}$ input to the primary winding 1B takes a negative value. Thus, the magnetic field generated by the primary winding 1A and the magnetic field generated by the primary winding 1C are oriented in the same direction, and the magnetic field generated by the primary winding 1B is oriented in the opposite direction. As a result, as shown in FIG. 2D, the output voltage $V_2$ takes the positive value. Further, between time t1 and time t2, the AC voltage $V_{1A}$ input to the primary winding 1A takes the positive value, the AC voltage $V_{1B}$ input to the primary winding 1B and the AC voltage $V_{1C}$ input to the primary winding 1C respectively take the negative values, the AC voltage $V_{1B}$ input to the primary winding 1B takes the negative value. Thus, the magnetic field generated by the primary winding 1B and the magnetic field generated by the primary winding 1C are oriented in the same direction, and the magnetic field generated by the primary winding 1A is oriented in the opposite direction. As a result, as illustrated in FIG. 2D, the output voltage $V_2$ takes the negative value. Subsequently, the similar event occurs after time t2, and therefore the frequency of the output voltage $V_2$ is three times as large as the frequency f of the respective AC voltages $V_{1A}$, $V_{1B}$, and $V_{1C}$, as shown in FIG. 2D. That is, the frequency of the output voltage $V_2$ is 3 f.

In the operation example of the driving circuit A1 shown in FIG. 2, one of the plurality of primary windings 1A-1C corresponds to the "first primary winding", and one of the rest two corresponds to the "second primary winding".

<Control Board>

Next, a control board D1 provided with the driving circuit A1 is explained with reference to FIGS. 3 and 4.

The control board D1 is provided with a wiring substrate E1, a plurality of electronic components 9, and a plurality of connectors CN. FIG. 3 is a plan view illustrating the control board D1 and shows a layout of the plurality of electronic components 9 and the plurality of connectors CN. In FIG. 3, the plurality of electronic components 9, the plurality of connectors CN, and the like are drawn by imaginary lines (two-dot chain lines). FIG. 4 is a schematic sectional view illustrating the control board D1, and schematically shows the cross section along line IV-IV of FIG. 3. For ease of explanation, in FIGS. 3 and 4, three mutually perpendicular directions are defined as an x-direction, a y-direction, and a z-direction. The z-direction is a thickness direction of the control board D1. The x-direction is a right-and-left direction in the plan view of the control board D1 (see FIG. 3). The y-direction is an up-and-down direction in the plan view of the control board D1 (see FIG. 3). In the explanation below, the "plan view" is a view seen in the z-direction.

Figure 3:
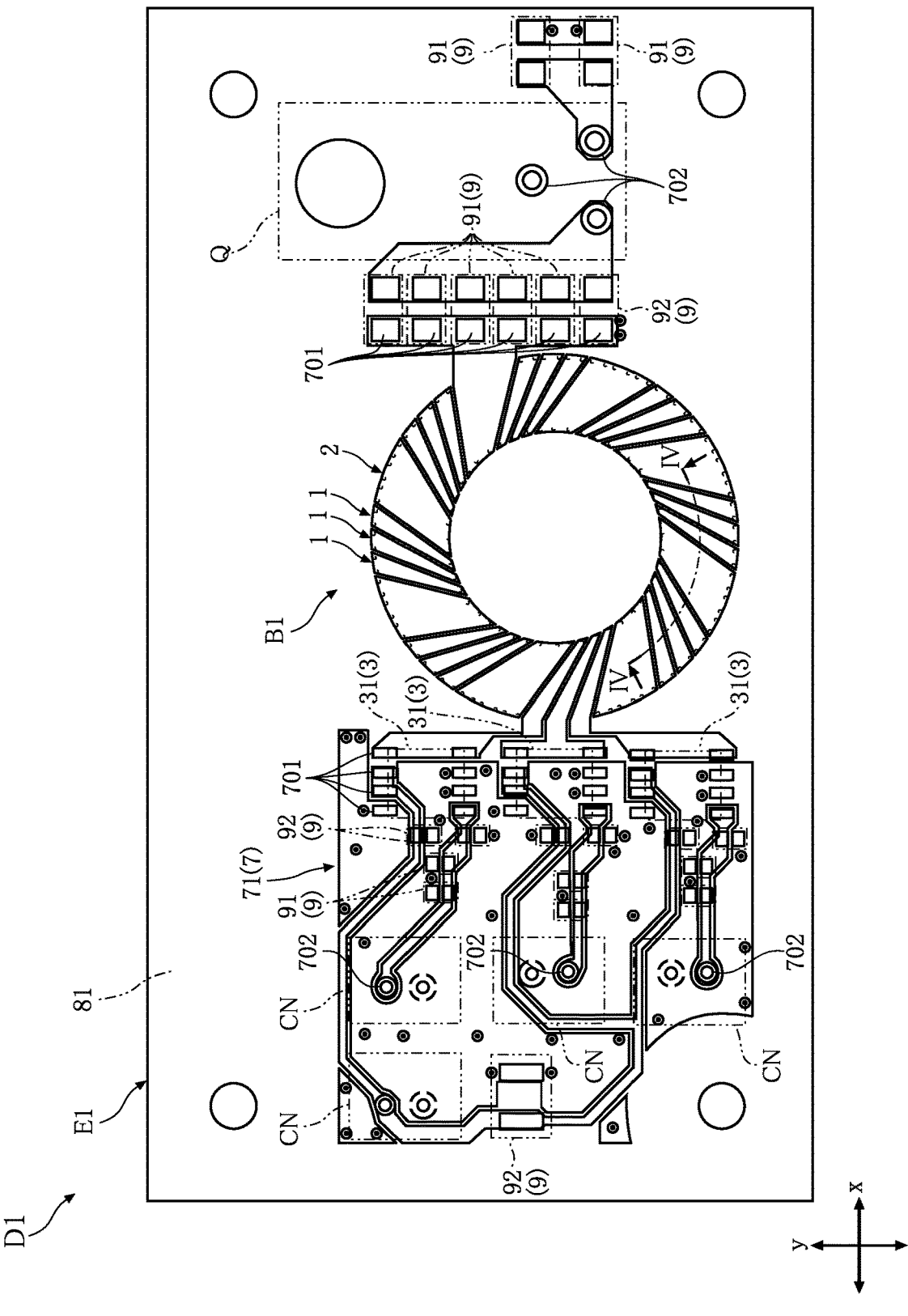
FIG. 3 is a plan view illustrating a control board provided with the driving circuit of the present disclosure.

The plurality of electronic components 9 include, for example, a plurality of resistors 91, a plurality of capacitors 92, and the like as shown in FIG. 3, besides the plurality of control ICs 3 of the above driving circuit A1. The plurality of resistors 91 and the plurality of capacitors 92 are components added as appropriate to more preferably perform the driving of the switching element Q in the driving circuit. As the plurality of resistors 91, gate resistors can be adopted.

Each of the plurality of connectors CN is a terminal to which an external device is connected. On the control board D1, to the plurality of connectors CN, a control device for generating a control signal (a PWN signal) dedicated for each control IC 3 to generate an AC signal (an AC voltage) is connected, for example. Each control IC 3 generates the AC signal (the AC voltage) via each connector CN based on the input control signal (the PWM signal). This PWM signal is adjusted as appropriate regarding the frequency, the duty ratio, the phase, and the like. Note that in one example, the PWM signals have the frequency f, the duty ratio of 50%, and the phases different from one another by $2\pi/n$.

The wiring substrate E1 is a printed circuit, for example. The wiring substrate E1 is not limited to the printed circuit, and can be a semiconductor substrate or a ceramic substrate. The wiring substrate E1 carries the air-core transformer B1 inside. The wiring substrate E1 is rectangular in a plan view, for example. The wiring substrate E1 carries the plurality of electronic components 9, the plurality of connectors CN, and the switching element Q. The wiring substrate E1 is provided with a plurality of wiring layers 7, a plurality of through electrodes 79, and an insulating member 8. The air-core transformer B1 is constituted by the plurality of wiring layers 7 and the plurality of through electrodes 79.

The plurality of wiring layers 7 are respectively made of metal. The constituent material of the respective wiring layers 7 is Cu (copper) or Cu alloy, for example. The constituent material is not limited to Cu and Cu alloy. The plurality of wiring layers 7 include a first wiring layer 71, a second wiring layer 72, a third wiring layer 73, and a fourth wiring layer 74.

The first wiring layer 71, the second wiring layer 72, the third wiring layer 73, and the fourth wiring layer 74 are laminated from one end of the z-direction (the upper side in FIG. 4) toward the other end of the z-direction (the lower side in FIG. 4), and are separated from one another. A wiring pattern is formed on each of the first wiring layer 71, the second wiring layer 72, the third wiring layer 73, and the fourth wiring layer 74.

The plurality of through electrodes 79 penetrate the insulating member 8 partially in the z-direction. Each through electrode 79 is a through via, for example, and conducts between two or more wiring layers 7. The constituent material of the respective through electrodes is Cu (copper) or Cu alloy, for example, but is not limited to them. The plurality of through electrodes 79 include the one that conducts the first wiring layer 71 and the fourth wiring layer 74, and the one that conducts the second wiring layer 72 and the third wiring layer 73. In addition to these, the plurality of through electrodes 79 include the one that conducts the first wiring layer 71 and the second wiring layer 72 or the third wiring layer 73, the one that conducts the second wiring layer 72 and the fourth wiring layer 74, and the one that conducts the third wiring layer 73 and the fourth wiring layer 74, as appropriate.

On the wiring substrate E1, the air-core transformer B1 is constituted by the wiring pattern of the plurality of wiring layers 7 (the first wiring layer 71, the second wiring layer 72, the third wiring layer 73, and the fourth wiring layer 74) and the plurality of through electrodes 79. The details of the structure of the air-core transformer B1 will be described later. Further, according to the wiring pattern in the plurality of wiring layers 7 and the plurality of through electrodes 79, a conduction path is configured which appropriately conducts the plurality of electronic components 9, the plurality of connectors CN, the air-core transformer B1, and the switching element Q. The wiring pattern in the first wiring layer 71 is partially exposed from the insulating member 8, and the respective electronic components 9 are conductively joined to electrode pads 701 formed on the exposed part or to insertion electrode parts 702 that penetrate the wiring substrate E1. For instance, in the example shown in FIG. 3, the respective electronic components 9 are joined to the electrode pads 701, and the switching element Q and the respective connectors CN are joined to the insertion electrode parts 702.

Figure 4:
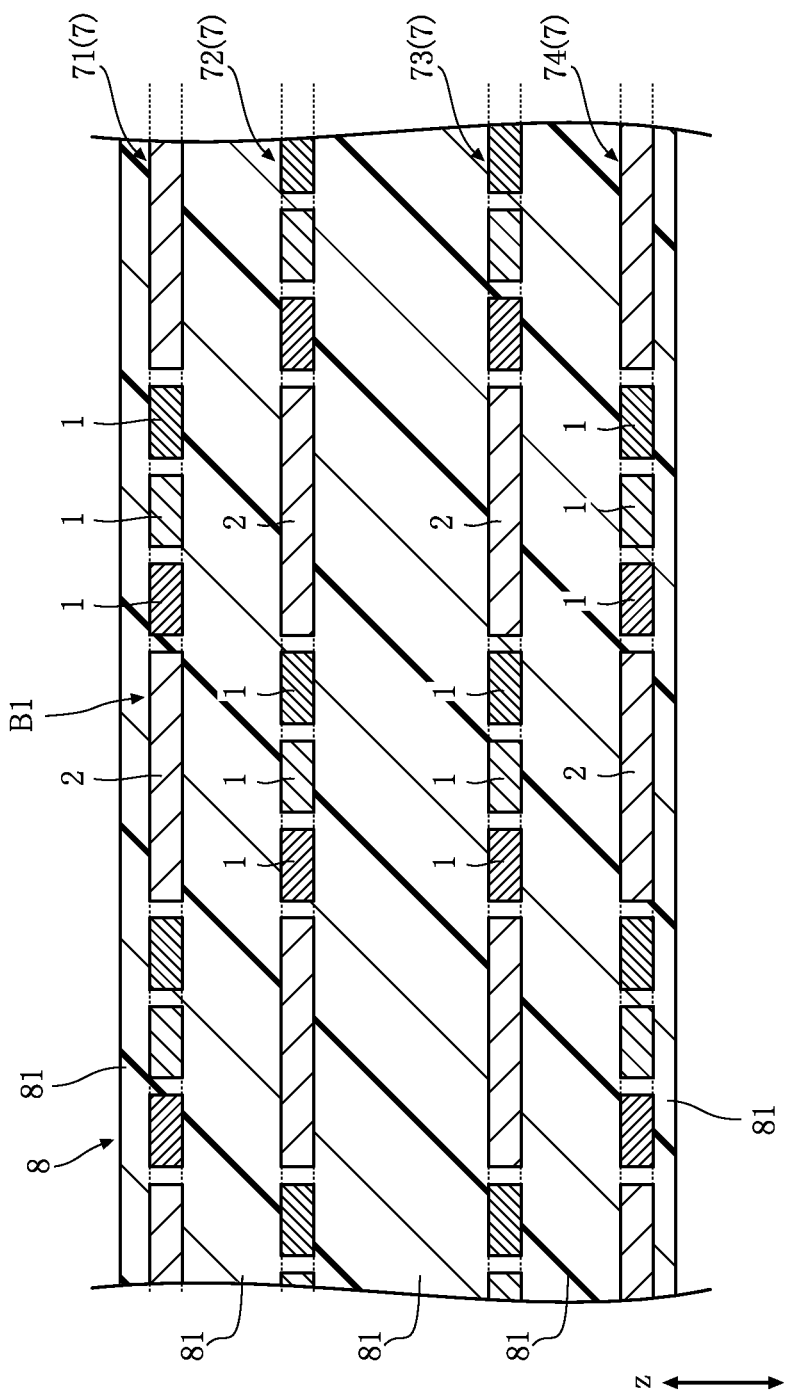
FIG. 4 is a schematic sectional view illustrating the control board provided with the driving circuit of the present disclosure, which is a schematic view of a cross section along line IV-IV of FIG. 3.

The insulating member 8 covers the plurality of wiring layers 7 and the plurality of through electrodes 79, as shown in FIGS. 3 and 4. Thus, the insulating member 8 covers the air-core transformer B1. The constituent material of the insulating member 8 is an insulating resin such as glass epoxy resin. The material of the insulating member 8 is not limited to the insulating resin, and an insulation-treated semiconductor material (e.g., Si (silicon)) or ceramic can be adopted. As the insulation treatment as above, doping of the insulation impurities, a formation of the insulating oxide film, and so forth can be considered.

The insulating member 8 includes a plurality of insulating layers 81, as shown in FIG. 4. The plurality of insulating layer 81 includes the one interposed between the first wiring layer 71 and the second wiring layer 72 in the z-direction, the one interposed between the second wiring layer 72 and the third wiring layer 73 in the z-direction, and the one interposed between the third wiring layer 73 and the fourth wiring layer 74 in the z-direction. Moreover, the plurality of insulating layers 81 further include the one formed over the first wiring layer 71 (on the one end of the z-direction), the one formed beneath the fourth wiring layer 74 (on the other end of the z-direction). In FIG. 3, an insulating layer 81 formed over the first wiring layer 71 (on the one end of the z-direction) is drawn by an imaginary line (a two-dot chain line). The insulating layer 81 formed over the first wiring layer 71 has an opening, and the first wiring layer 71 is partially exposed from the opening. In this opening, an electrode pad 701, for example, is formed.

<Air-Core Transformer>

Next, an example of the structure of the air-core transformer B1 is explained with reference to FIGS. 5-16.

As shown in FIGS. 5-16, on the air-core transformer B1, the plurality of primary windings 1 and the secondary winding 2 are alternately wound, and each of them is doubly wound. As to each of the plurality of primary windings 1 and the secondary winding 2, the planar components are wound toroidally. The air-core transformer B1 includes, as its structure, first cylindrical part 5A and second cylindrical part 5B according to the configuration detailed later. The first cylindrical part 5A and the second cylindrical part 5B are configured that their planar components have a circular toroidal shape. The first cylindrical part 5A and the second cylindrical part 5B have a common central axis in a plan view. For ease of understanding, the direction in which this central axis extends is defined as an axial direction s, a direction around this central axis is defined as a circumferential direction t, and a direction to extend radially from the central axis is defined as a radial direction u. The axial direction s is approximately identical to the z-direction on the control board D1. The circumferential direction t is identical to the respective toroidal directions of the first cylindrical part 5A and the second cylindrical part 5B, and the radial direction t is also identical to the respective toroidal directions of the plurality of primary windings 1 and the secondary winding 2.

Figure 5:
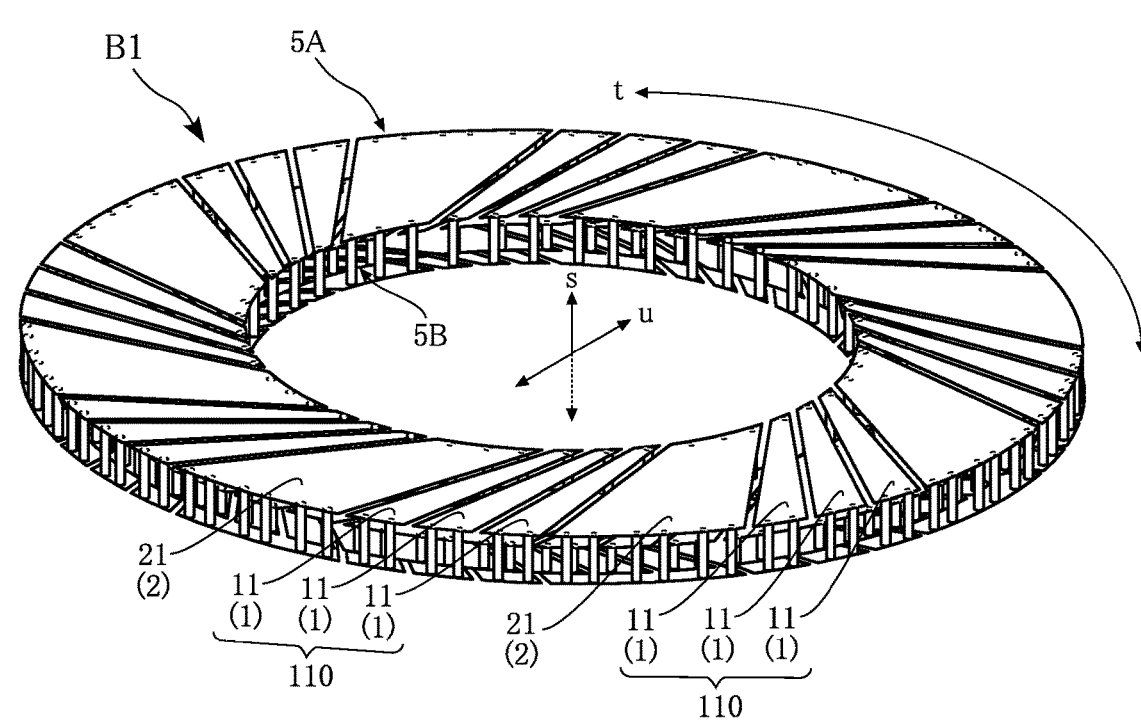
FIG. 5 is a perspective view illustrating an air-core transformer of the present disclosure.
Figure 6:
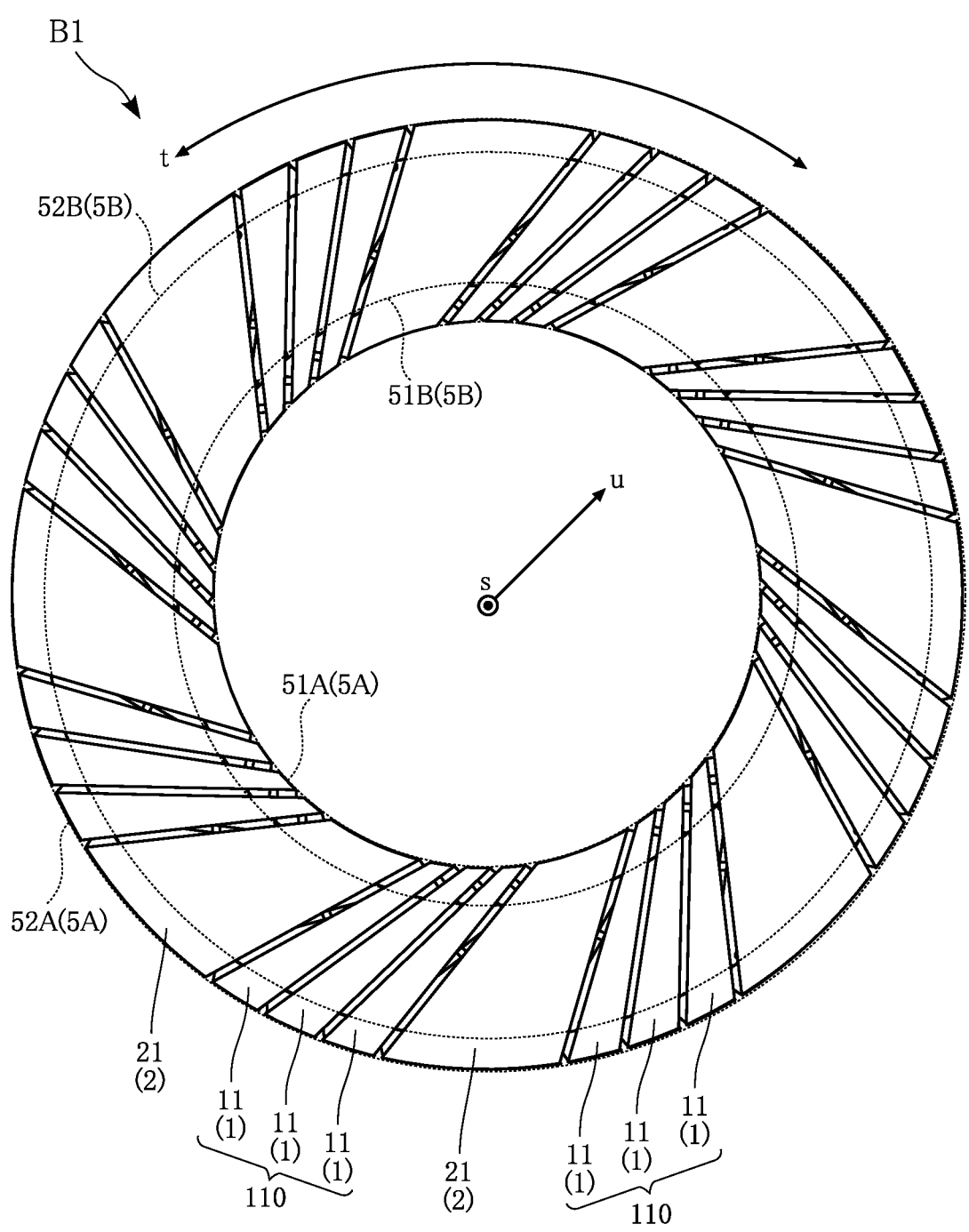
FIG. 6 is a plan view illustrating the air-core transformer of the present disclosure.
Figure 7:
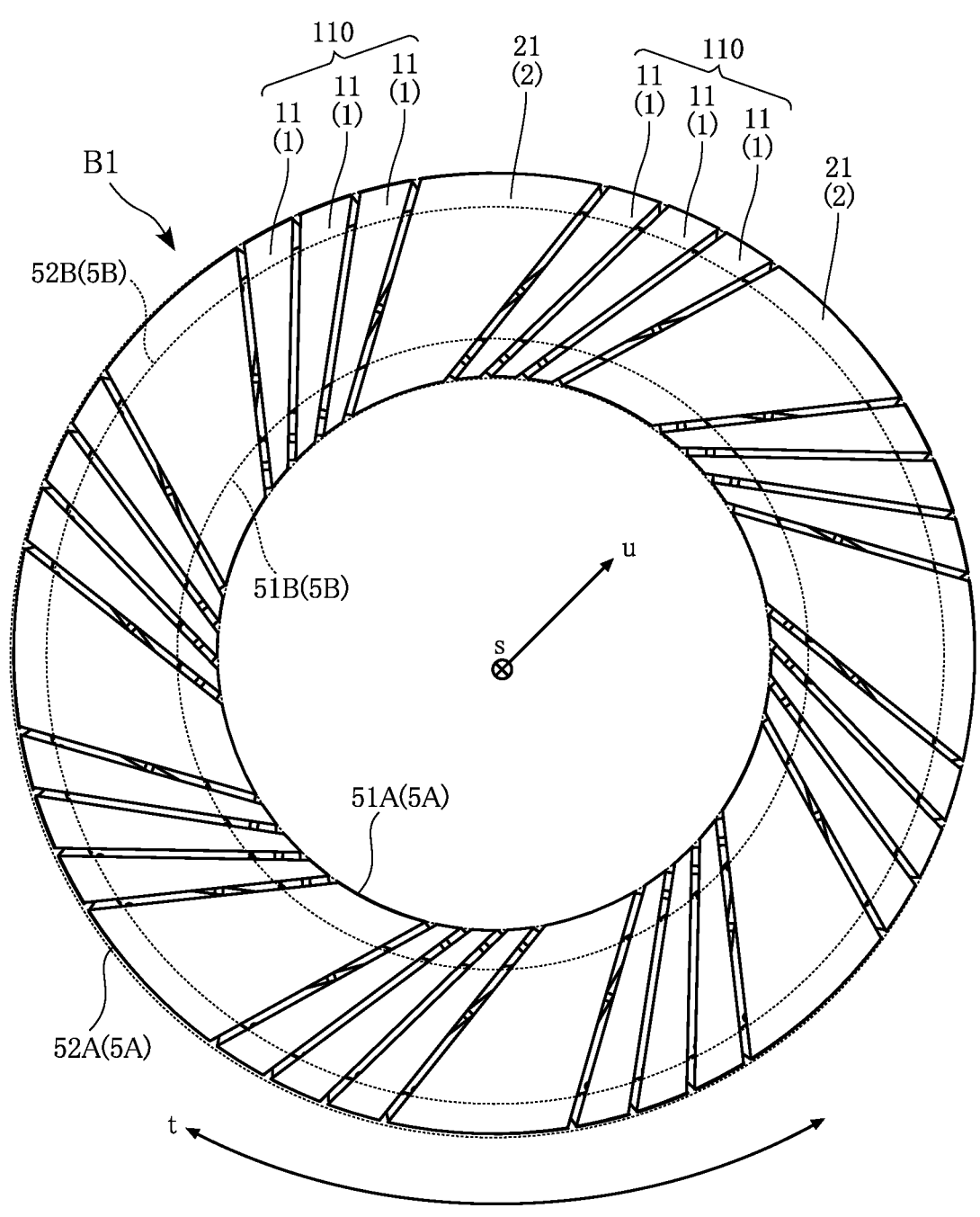
FIG. 7 is a bottom view illustrating the air-core transformer of the present disclosure.
Figure 8:
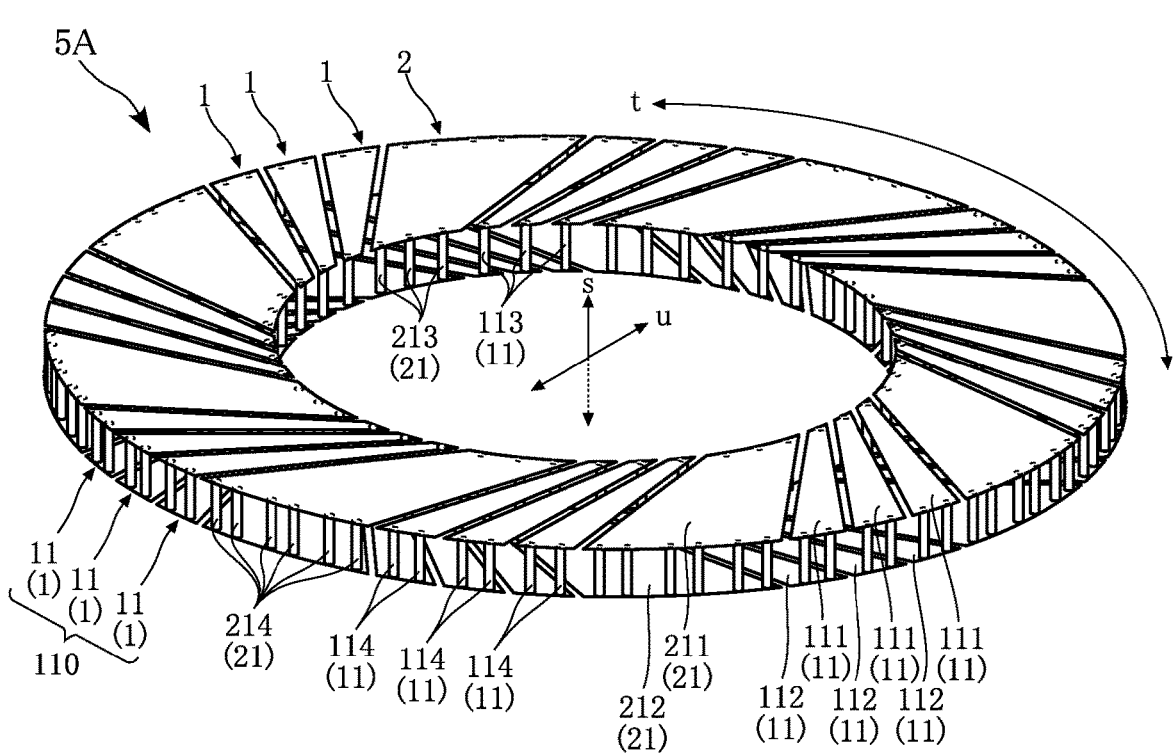
FIG. 8 is a perspective view illustrating a first cylindrical part (a part of the air-core transformer) of the present disclosure.
Figure 9:
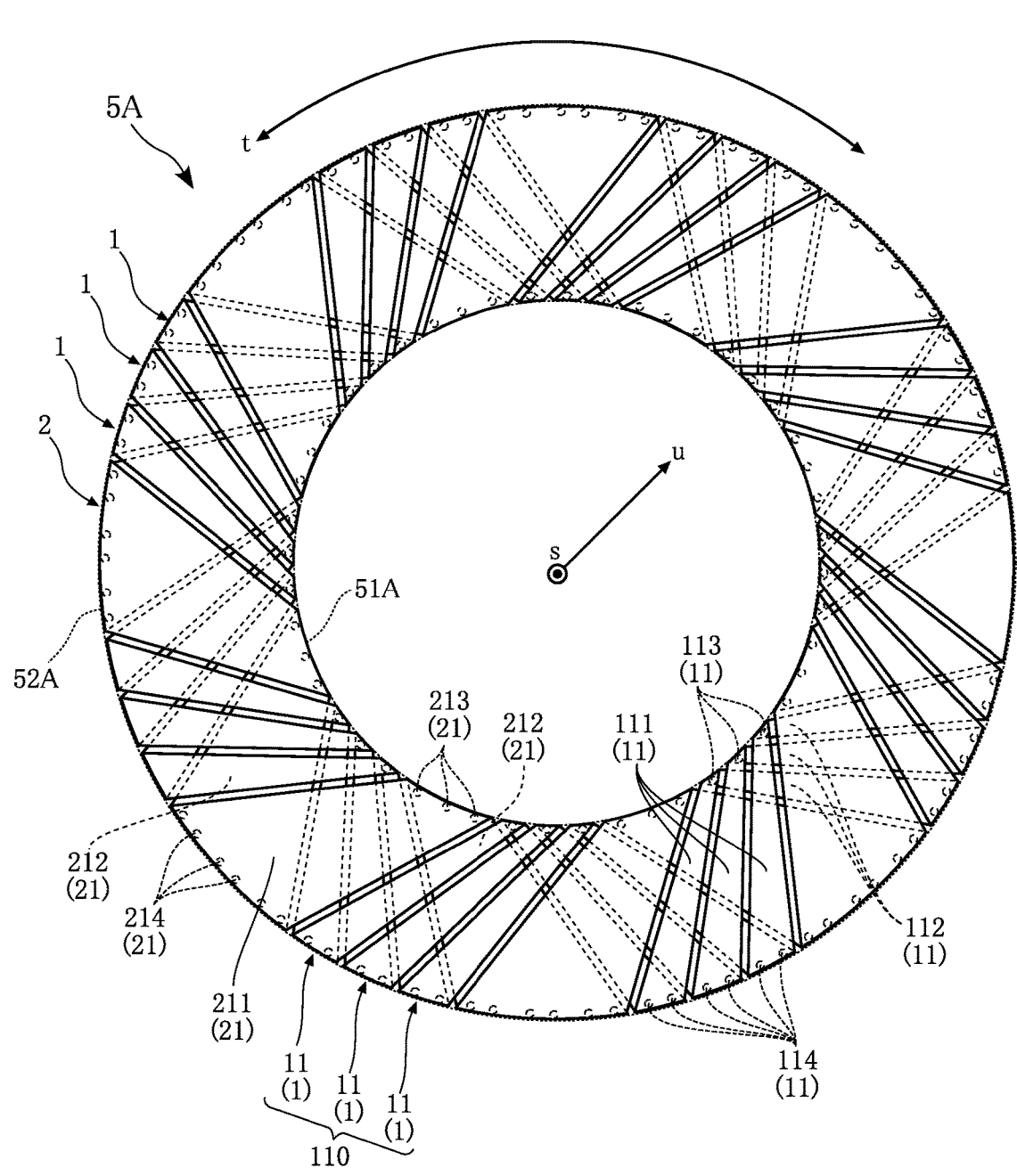
FIG. 9 is a plan view illustrating the first cylindrical part of the present disclosure.
Figure 10:
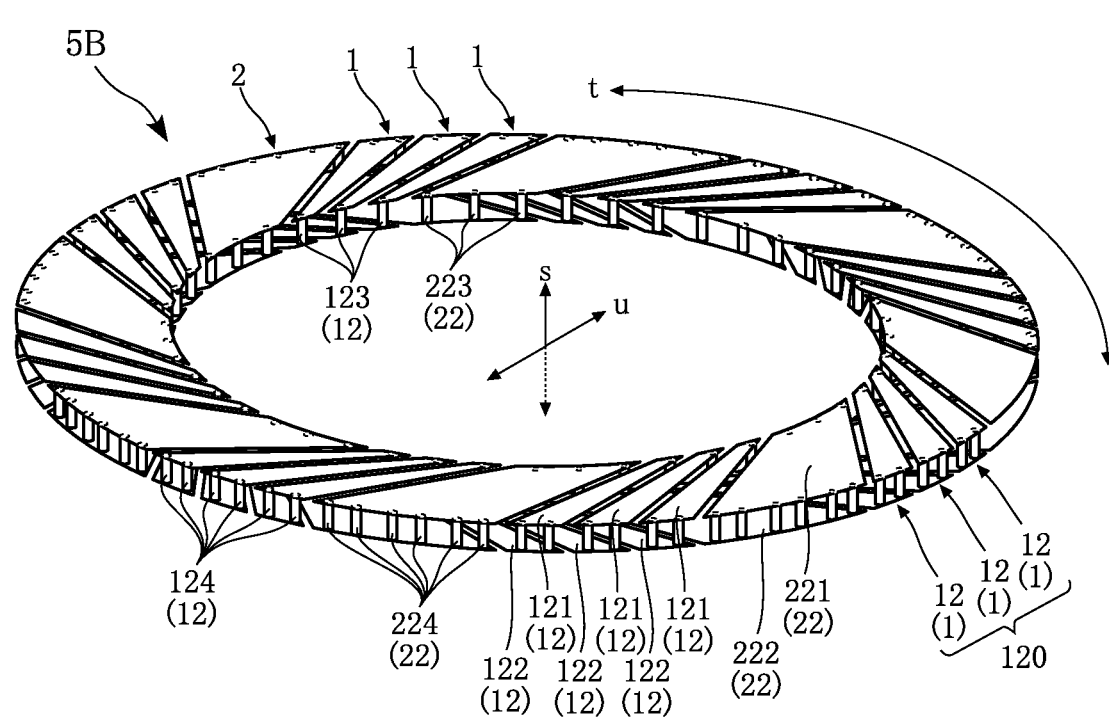
FIG. 10 is a perspective view illustrating a second cylindrical part (a part of the air-core transformer) of the present disclosure.
Figure 11:
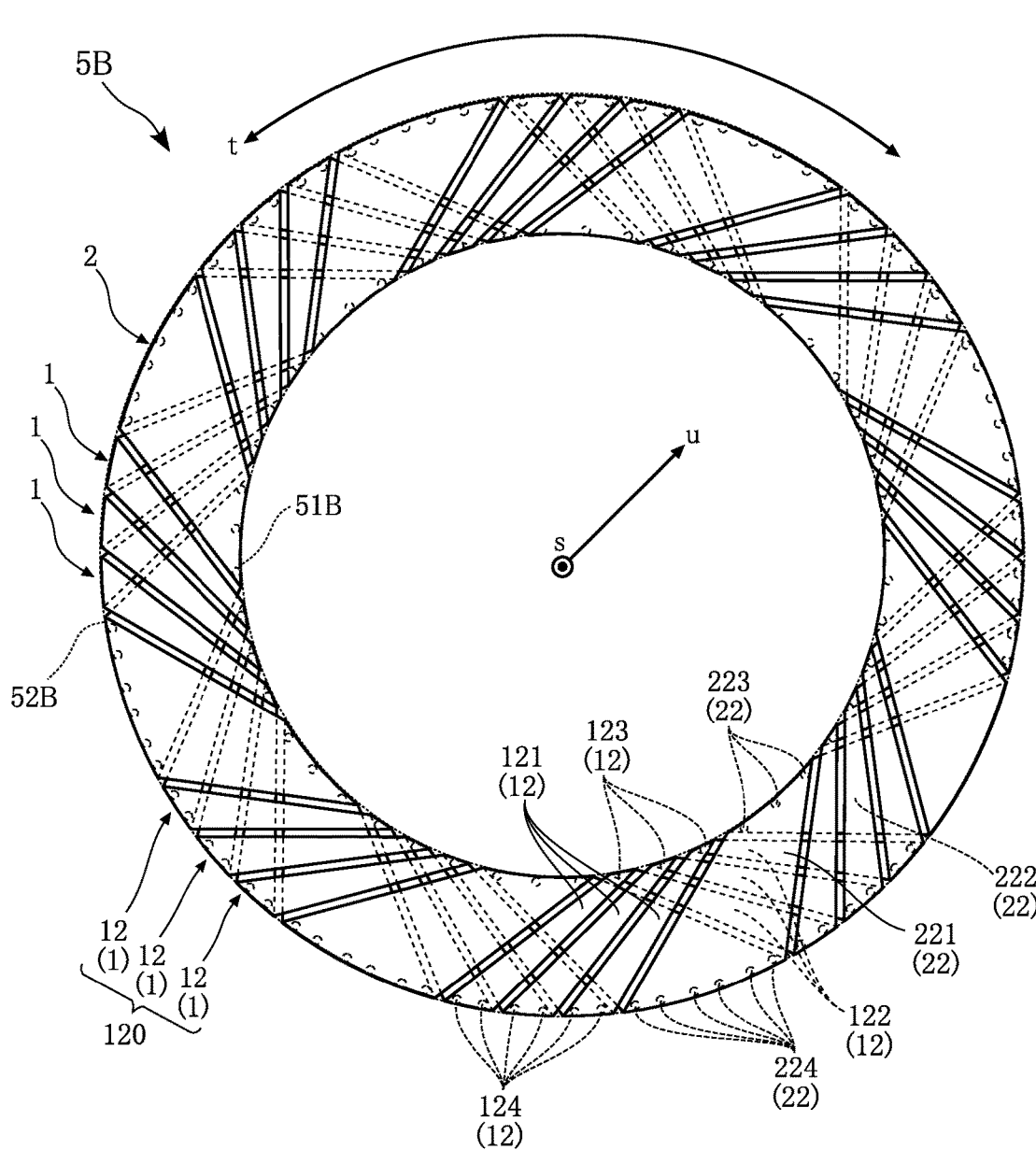
FIG. 11 is a plan view illustrating the second cylindrical part of the present disclosure.
Figure 12:
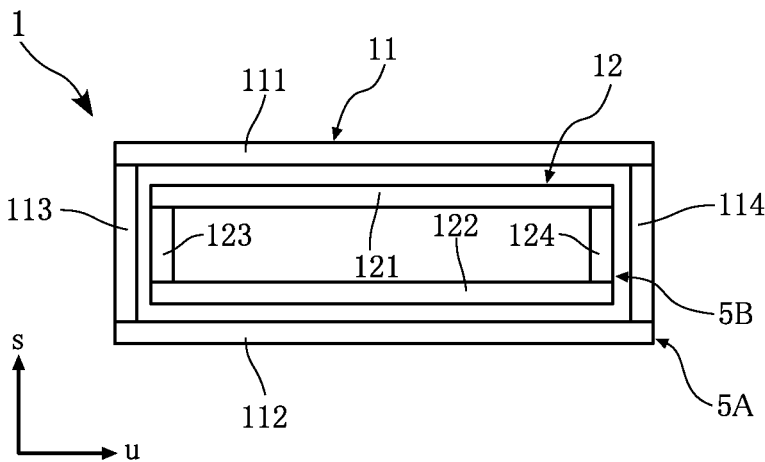
FIG. 12 is a schematic view illustrating respective primary windings of the present disclosure as seen in the circumferential direction.
Figure 13:
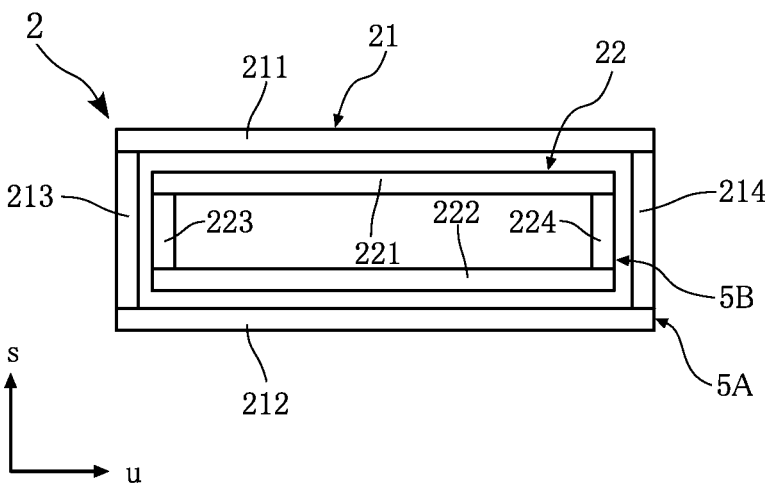
FIG. 13 is a schematic view illustrating a secondary winding of the present disclosure as seen in the circumferential direction.
Figure 14:
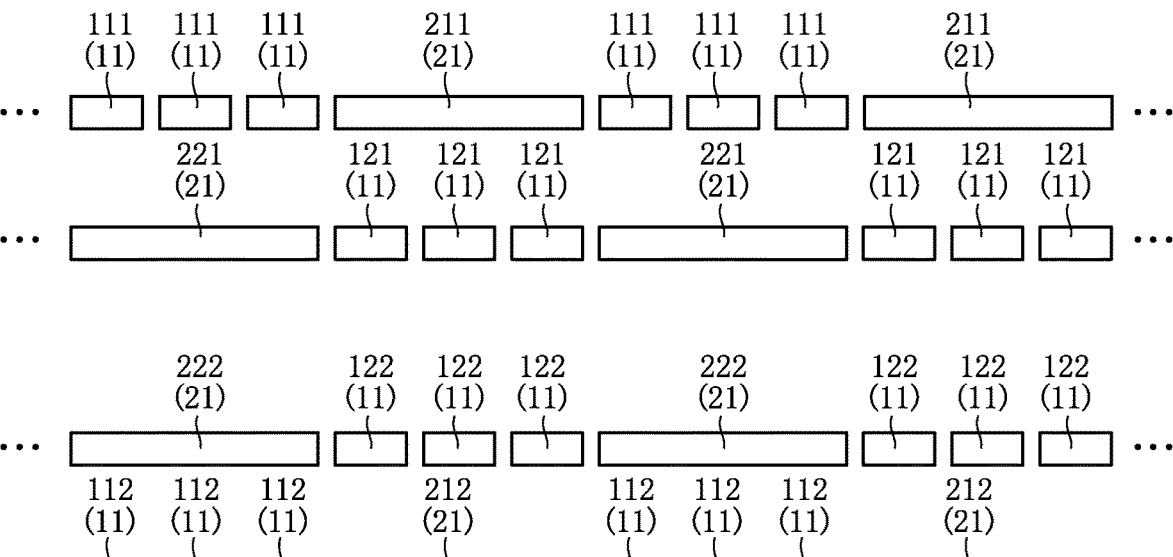
FIG. 14 is a schematic view illustrating the alignment of the air-core transformer of the present disclosure in the circumferential direction.
Figure 14:
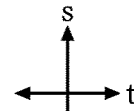
Figure 15:
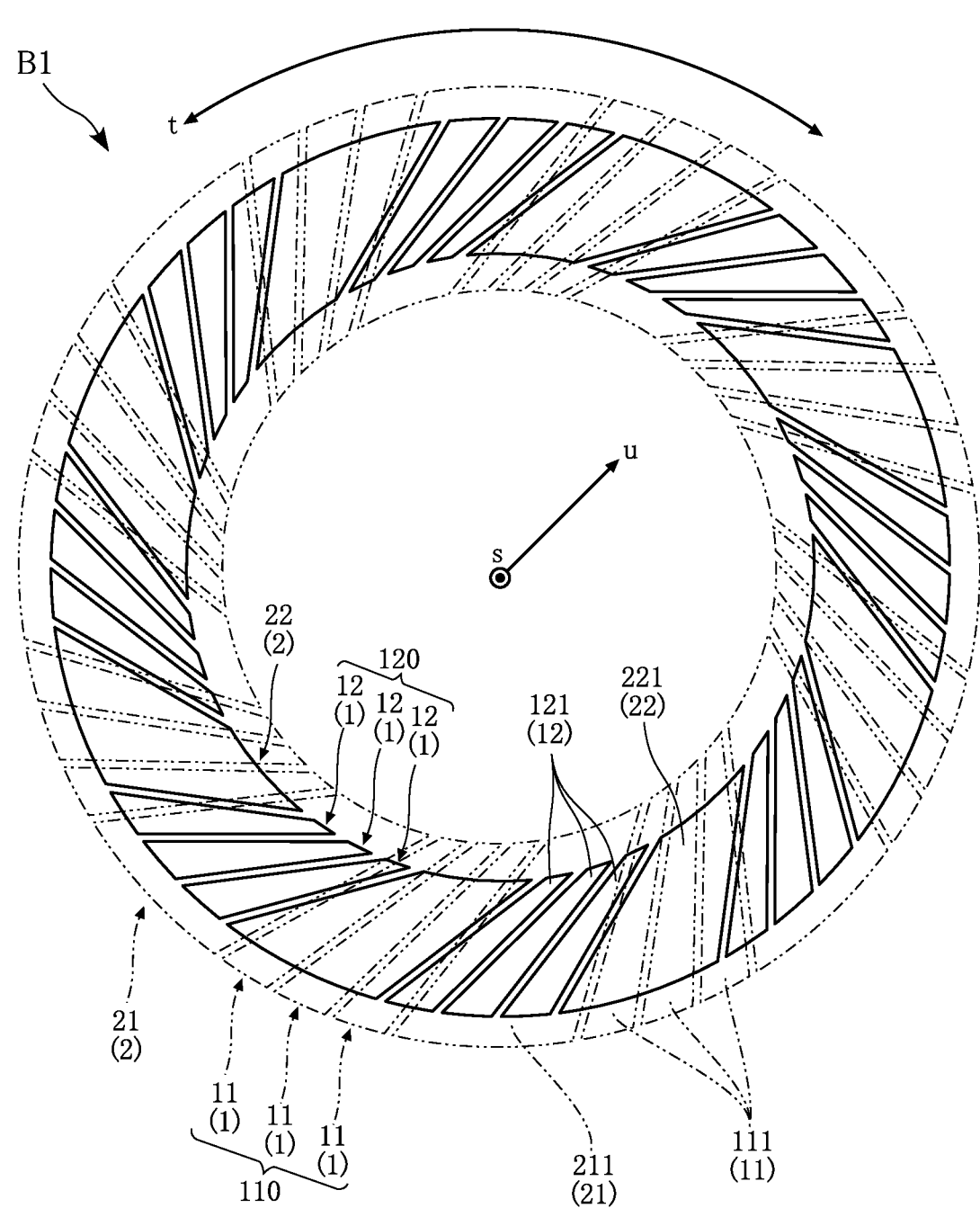
FIG. 15 is a plan view illustrating a part of the air-core transformer of the present disclosure.
Figure 16:
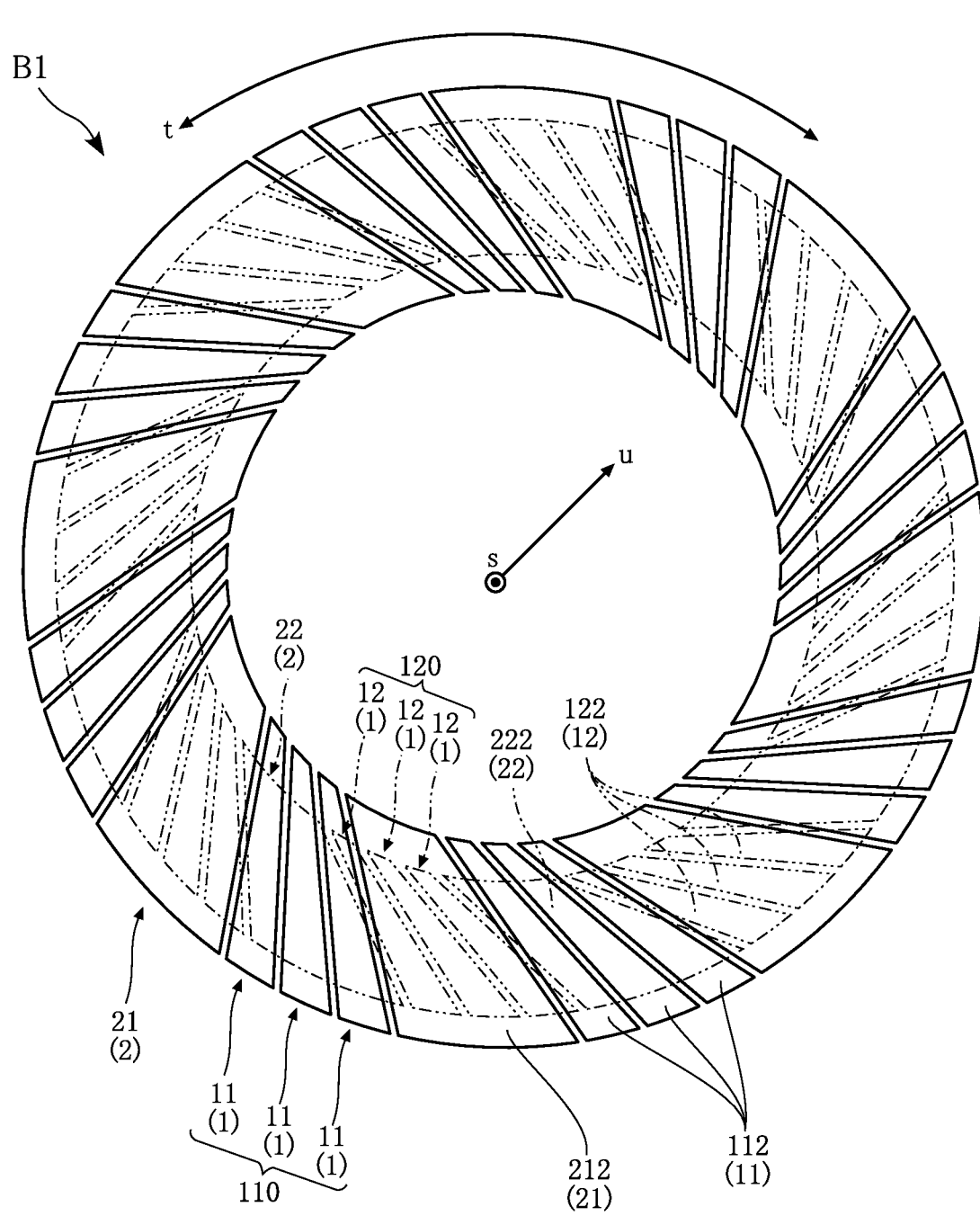
FIG. 16 is a plan view illustrating a part of the air-core transformer of the present disclosure.

FIG. 5 is a perspective view illustrating the air-core transformer B1. FIG. 6 is a plan view illustrating the air-core transformer B1. FIG. 7 is a bottom view illustrating the air-core transformer B1. FIG. 8 is a perspective view illustrating the first cylindrical part 5A of the air-core transformer B1. FIG. 9 is a plan view illustrating the first cylindrical part 5A of the air-core transformer B1. FIG. 10 is a perspective view illustrating the second cylindrical part 5B of the air-core transformer B1. FIG. 11 is a plan view illustrating the second cylindrical part 5B of the air-core transformer B1. FIG. 12 is a schematic view illustrating the respective primary windings 1 as seen in the circumferential direction t. FIG. 13 is a schematic view illustrating the secondary winding 2 as seen in the circumferential direction t. FIG. 14 is a schematic view illustrating the alignment of the air-core transformer B1 in the circumferential direction t. FIG. 15 is a plan view illustrating a part of the air-core transformer B1. FIG. 16b is a plan view illustrating a part of the air-core transformer B1. FIG. 15 shows a part above the central portion with respect to the axial direction s. FIG. 16 shows a part below the central portion with respect to the axial direction s.

As shown in FIGS. 5-11, the first cylindrical part 5A and the second cylindrical part 5B respectively have a toroidal shape as described above. The planar shapes of the first cylindrical part 5A and the second cylindrical part 5B are ring-like and they substantially come full circle, and it is preferable that they are circular, elliptical, or polygonal, for example. Note that the planar shapes of the first cylindrical part 5A and the second cylindrical part 5B do not have to come full circle. The sectional shapes of the first cylindrical part 5A and the second cylindrical part 5B are respectively ring-like and substantially come full circle, and it is preferable that they are circular, elliptical, or polygonal, for example. Note that the overall shapes of the first cylindrical part 5A and the second cylindrical part 5B are configured as various combinations of the above planar shapes and the above sectional shapes, and in the present embodiment, the planar shapes are circularly ring-like, and at the same time the sectional shapes are rectangularly ring-like. The second cylindrical part 5B are located inside the first cylindrical part 5A, and the first cylindrical part 5A gives the external appearance of the air-core transformer B1. The above planar shapes are shapes as seen in the axial direction s, and the above sectional shapes are shapes of the cross sections in the planes defined by the axial direction s and the radial direction u.

The plurality of primary windings 1 generate a magnetic field due to an input current (a current according to the above AC voltage) from outside. As shown in FIGS. 5-12 and 14-16, the plurality of primary windings 1 respectively include a plurality of first circulation parts 11 and a plurality of second circulation parts 12, according to the structure of the air-core transformer B1. The first circulation parts 11 of each primary winding 1 correspond to the "primary side first circulation parts" and the second circulation parts 12 of each primary winding 1 correspond to the "primary side second circulation parts".

In each primary winding 1, each of the plurality of first circulation parts 11 has, for example, a rectangularly ring-like shape as seen in the circumferential direction t, as shown in FIG. 12. The plurality of first circulation parts 11 are aligned in the circumferential direction t as seen in the axial direction s, as shown in FIGS. 6-9. The plurality of first circulation parts 11 are a part of the first cylindrical part 5A. Further, as shown in FIGS. 6-9, the respective first circulation parts 11 of the plurality of primary windings 1 are aligned in the circumferential direction t, and constitute one first circulation part group 110. Each first circulation part group 110 is located, as seen in the axial direction s, between one part (the first circulation part 21 to be described later) and another part of the secondary winding 2 arranged along the circumferential direction t. In the present embodiment, each first circulation part group 110 is constituted by the respective first circulation parts 11 of three primary windings 1. The first circulation part group 110 corresponds to the "primary side first circulation part group". The first cylindrical part 5A of the air-core transformer B1 is configured that the plurality of first circulation part groups 110 are arranged along the circumferential direction t. Each of the plurality of first circulation parts 11 in each primary winding 1 includes, as shown in FIGS. 8, 9, 12, and 14, a first upper conductor part 111, a first lower conductor part 112, and a pair of first connection conductor parts 113 and 114. The first upper conductor part 111 corresponds to the "primary side first upper conductor part", and the first lower conductor part 112 corresponds to the "primary side first lower conductor part".

As for each first circulation part 11, the first upper conductor part 111 and the first lower conductor part 112 are separated from each other in the axial direction s, as shown in FIGS. 12 and 14. The first upper conductor part 111 and the first lower conductor part 112 respectively extend, as shown in FIG. 9, from an inner periphery 51A of the first cylindrical part 5A toward an outer periphery 52A of the first cylindrical part 5A as seen in the axial direction s, and in the present embodiment, they have a band-like shape tapering as they extend from the outer periphery 52A toward the inner periphery 51A. Note that the more the number of turns of each primary winding 1 (the number of the first circulation parts 11) gets, the less the degree of tapering of the first upper conductor part 111 and the first lower conductor part 112 respectively get as seen in the axial direction s. The pair of first connection conductor parts 113 and 114 respectively extend, as shown in FIG. 12, from the first upper conductor part 111 in the axial direction s. The first connection conductor part 113 is connected to the first lower conductor part 112 of the same first circulation part 11. The first connection conductor part 114 is connected to the first lower conductor part 112 of the first circulation part 11 that is adjacent in the circumferential direction t. The pair of first connection conductor parts 113 and 114 are approximately perpendicular to the first upper conductor part 111 and the first lower conductor part 112, respectively. The first connection conductor part 113 is arranged on an inner periphery 51A side of the first cylindrical part 5A as seen in the axial direction s, and the first connection conductor part 114 is arranged on an outer periphery 52A side of the first cylindrical part 5A as seen in the axial direction s. The pair of first connection conductor parts 113 and 114 respectively have circular columnar shapes as seen in the axial direction s.

In the present embodiment, as shown in FIG. 9, each first upper conductor part 111 is inclined in one sense of the circumferential direction t with respect to the radial direction u, and each first lower conductor part 112 is inclined in the other sense of the circumferential direction t with respect to the radial direction u. For instance, in the example shown in FIG. 9, with respect to a radial direction u overlapped with each first connection conductor part 113, the first upper conductor part 111 connected to said first connection conductor 113 is inclined in the circumferential direction t clockwise, and the first lower conductor part 112 connected to said first connection conductor part 113 is inclined in the circumferential direction t anticlockwise. Like this, as the first upper conductor part 111 and the first lower conductor part 112 are inclined in the circumferential direction t inversely with respect to the radial direction u, the pair of first connection conductor parts 113 and 114 can be formed respectively to extend in the axial direction s. Note that the more the number of turns of each primary winding 1 (the number of first circulation parts 11) gets, the less the degrees of inclinations with respect to the axial direction u of each first upper conductor part 111 and each first lower conductor part 112 get.

Further, in the present embodiment, as shown in FIG. 9, in each first circulation part group 110, two first upper conductor parts 111 adjacent to each other in the circumferential direction t and two first lower conductor parts 112 adjacent to each other in the circumferential direction t are respectively arranged so as to have a predetermined space in-between. The space is approximately the same on the inner periphery 51A side and on the outer periphery 52A side of the first cylindrical part 5A, for example. According to this arrangement, as seen in the axial direction s, each first upper conductor part 111 and each first lower conductor part 112 have the sizes on the inner periphery 51A side with respect to the circumferential direction t smaller than the sizes on the outer periphery 52A side with respect to the circumferential direction t. That is, as described above, the first upper conductor part 111 and the first lower conductor part 112 respectively have a tapered shape as seen in the axial direction s.

At each primary winding 1, as for the plurality of first circulation parts 11, two first circulation parts 11 adjacent to each other in the circumferential direction t are directly connected to each other, and the input current that flows in each primary winding 1 runs in the plurality of first circulation parts 11 in order. This time, the first connection conductor part 114 of each first circulation part 11 receives the input current from the first lower conductor part 112 of the first circulation part 11 adjacent thereto in one sense of the circumferential direction t. Then, this input current flows from the first connection conductor part 114 via the first upper conductor part 111 and the first connection conductor part 113 to the first lower conductor part 112. That is, in the example shown in FIG. 12, the input current that flows in the respective first circulation parts 11 runs anticlockwise. Further, it is transmitted to the first circulation part 11 adjacent thereto in the other sense of the circumferential direction t. Likewise, the input current of each primary winding 1 circulates the plurality of first circulations parts 11 respectively. Note that the direction of the input current that flows in each first circulation part 11 can be opposite to that of the above example. That is, in each primary winding 1, the first lower conductor part 112 of each first circulation part 11 receives the input current from the first connection conductor part 114 of the first circulation part 11 adjacent thereto in the other sense of the circumferential direction t. Further, this input current flows from the first lower conductor part 112 via the first connection conductor part 113 and the first upper conductor part 111 to the first connection conductor part 114. That is, in the example shown in FIG. 12, the input current that flows in the respective first circulation parts 11 may be configured to run clockwise.

In each primary winding 1, each of the plurality of second circulation parts 12 has, for example, a rectangularly ring-like shape as seen in the circumferential direction t, as shown in FIG. 12. The plurality of second circulation parts
12 are respectively positioned inside the plurality of first
circulation parts 11, as seen in the circumferential direction
t, as shown in FIG. 12. At each primary winding 1, the
plurality of second circulation parts 12 are arranged along
the circumferential direction t, as seen in the axial direction,
as shown in FIGS. 10 and 11. Further, as shown in FIGS. 10
and 11, the respective second circulation parts 12 of the
plurality of primary windings 1 are arranged along the
circumferential direction t, and constitute one second circu-
lation part group 120. Each second circulation part group
120 is located between one part (the second circulation part
22 to be described later) and another part of the secondary
windings 2 arranged along the circumferential direction t, as
seen in the axial direction s. In the present embodiment, each
second circulation part group 120 is constituted by the
respective second circulation parts 12 of three primary
windings 1. The second circulation part group 120 corre-
sponds to the "primary side second circulation part group".
As for the second cylindrical part 5B of the air-core trans-
former B1, the plurality of second circulation part groups
120 are arranged along the circumferential direction t. Each
of the plurality of second circulation parts 12 of each
primary winding 1 includes, as shown in FIGS. 10-12 and
14, a second upper conductor part 121, a second lower
conductor part 122, and a pair of second connection con-
ductor parts 123 and 124. The second upper conductor part
121 corresponds to the "primary side second upper conduc-
tor part", and the second lower conductor part 122 corre-
sponds to the "primary side second lower conductor part".

As for each second circulation part 12, the second upper
conductor part 121 and the second lower conductor part 122
are separated from each other in the axial direction s as
shown in FIGS. 12 and 14. The second upper conductor part
121 and the second lower conductor part 122 respectively
extend, as shown in FIG. 11, from an inner periphery 51B of
the second cylindrical part 5B toward an outer periphery
52B of the second cylindrical part 5B as seen in the axial
direction s, and in the present embodiment, they have a
band-like shape tapering as they extend from the outer
periphery 52B toward the inner periphery 51B. Note that the
more the number of turns of each primary winding 1 (the
number of the second circulation parts 12) gets, the less the
degrees of tapering of the second upper conductor part 121
and the second lower conductor part 122 respectively get as
seen in the axial direction s. The pair of second connection
conductor parts 123 and 124 respectively extend, as shown
in FIG. 12, from the second upper conductor part 121 in the
axial direction s. The second connection conductor part 123
is connected to the second lower conductor part 122 of the
same second circulation part 12. The second connection
conductor part 124 is connected to the second lower con-
ductor part 122 of the second circulation part 12 that is
adjacent in the circumferential direction t. The pair of
second connection conductor parts 123 and 124 are approxi-
mately perpendicular to the second upper conductor part 121
and the second lower conductor part 122, respectively. The
second connection conductor part 123 is arranged on an
inner periphery 51B side of the second cylindrical part 5B as
seen in the axial direction s, and the second connection
conductor part 124 is arranged on an outer periphery 52B
side of the second cylindrical part 5B as seen in the axial
direction s. The pair of second connection conductor parts
123 and 124 have circular columnar shapes.

In the present embodiment, as shown in FIG. 11, each
second upper conductor part 121 is inclined in one sense of
the circumferential direction t with respect to the radial direction u, and each second lower conductor part 122 is
inclined in the other sense of the circumferential direction t
with respect to the radial direction u. For instance, in the
example shown in FIG. 11, with respect to a radial direction
u overlapped with each second connection conductor part
123, the second upper conductor part 121 connected to said
second connection conductor part 123 is inclined in the
circumferential direction t clockwise, and the second lower
conductor part 122 connected to said second connection
conductor part 123 is inclined in the circumferential direc-
tion t anticlockwise. Like this, as the second upper conduc-
tor part 121 and the second lower conductor part 122 are
inclined in the circumferential direction t inversely with
respect to the radial direction u, the pair of second connec-
tion conductor parts 123 and 124 can be formed respectively
to extend in the axial direction s. Note that the more the
number of turns of each primary winding 1 (the number of
second circulation parts 12) gets, the less the degrees of
inclinations with respect to the axial direction u of each
second upper conductor part 121 and each second lower
conductor part 122 get.

Further, in the present embodiment, as shown in FIG. 11,
in each second circulation part group 120, two second upper
conductor parts 121 adjacent to each other in the circum-
ferential direction t and two second lower conductor parts
122 adjacent to each other in the circumferential direction t
are respectively arranged so as to have a predetermined
space in-between. The space is approximately the same on
the inner periphery 51B side and on the outer periphery 52B
side of the second cylindrical part 5B, for example. Accord-
ing to this arrangement, as seen in the axial direction s, each
second upper conductor part 121 and each second lower
conductor part 122 have the sizes on the inner periphery 51B
side with respect to the circumferential direction t smaller
than the sizes on the outer periphery 52B side with respect
to the circumferential direction t. That is, as described
above, the second upper conductor part 121 and the second
lower conductor part 122 respectively have a tapered shape
as seen in the axial direction s.

At each primary winding 1, as for the plurality of second
circulation parts 12, two second circulation parts 12 adjacent
to each other in the circumferential direction t are directly
connected to each other, and the input current that flows in
each primary winding 1 runs in the plurality of second
circulation parts 12 in order. This time, the second connec-
tion conductor part 124 of each second circulation part 12
receives the input current from the second lower conductor
part 122 of the second circulation part 12 adjacent thereto in
one sense of the circumferential direction t. Then, this input
current flows from the second connection conductor part 124
via the second upper conductor part 121 and the second
connection conductor part 123 to the second lower conduc-
tor part 122. That is, in the example shown in FIG. 12, the
input current that flows in the respective second circulation
parts 12 runs anticlockwise. Further, it is transmitted to the
second circulation part 12 adjacent thereto in the other sense
of the circumferential direction t. Likewise, the input current
of each primary winding 1 circulates the plurality of second
circulations parts 12 respectively. Note that the direction of
the input current that flows in each second circulation part 12
can be opposite to that of the above example. That is, in each
primary winding 1, the second lower conductor part 122 of
each second circulation part 12 receives the input current
from the second connection conductor part 124 of the
second circulation part 12 adjacent thereto in the other sense
of the circumferential direction t. Further, this input current
flows from the second lower conductor part 122 via the second connection conductor part 123 and the second upper conductor part 121 to the second connection conductor part 124. That is, in the example shown in FIG. 12, the input current that flows in the respective second circulation parts 12 may be configured to run clockwise.

As for each primary winding 1, one of the plurality of first circulation parts 11 and one of the plurality of second circulation parts 12 are connected. For example, the first lower conductor part 112 of one of the plurality of first circulation parts 11 and the second upper conductor part 121 of one of the plurality of second circulation parts 12 are connected, and they are conducted. This time, in the example shown in FIG. 12, one of the plurality of first circulation parts 11 and one of the plurality of second circulation parts 12 are connected, so that if the current that flows in the respective first circulation parts 11 runs anticlockwise, the current that flows in the respective second circulation parts 12 would also run anticlockwise, or, if the current that flows in the respective first circulation parts 11 runs clockwise, the current that flows in the respective second circulation parts 12 would also run clockwise. Each primary winding 1 is configured that the plurality of first circulation parts 11 are consecutively connected along the circumferential direction t, and the plurality of second circulation parts 12 are consecutively connected along the circumferential direction t. Further, as described above, one of the plurality of first circulation parts 11 and one of the plurality of second circulation parts 12 are connected, and therefore the input current of each primary winding 1 flows around the plurality of first circulation parts 11 and is thereafter input to the plurality of second circulation parts 12 to flow around the plurality of second circulation parts 12. In another embodiment, each primary winding 1 may be configured that the respective first circulation parts 11 and the respective second circulation parts 12 are alternatingly connected, and the input current of each primary winding 1 flows the respective first circulation parts 11 and the respective second circulation parts 12 alternatingly.

In the secondary winding 2, due to the influence of the magnetic field generated by the plurality of primary windings 1, an induction current runs. The secondary winding 2 includes, as shown in FIGS. 5-11 and 13-16, the plurality of first circulation parts 21 and the plurality of second circulation parts 22, according to the structure of the air-core transformer B1. The first circulation part 21 corresponds to the "secondary side first circulation part", and the second circulation part 22 correspond to the "secondary side second circulation part".

The plurality of first circulation parts 21 respectively have, for example, a rectangularly ring-like shape as seen in the circumferential direction t, as shown in FIG. 13. The plurality of first circulation parts 21 are aligned in the circumferential direction t as seen in the axial direction s, as shown in FIG. 13. The plurality of first circulation parts 21 are a part of the first cylindrical part 5A. As shown in FIGS. 6-9, the plurality of first circulation parts 21 are aligned in the circumferential direction t as seen in the axial direction s. Each of the plurality of first circulation parts 21 includes, as shown in FIGS. 8, 9, 13, and 14, a first upper conductor part 211, a first lower conductor part 212, and a pair of first connection conductor parts 213 and 214. The first upper conductor part 211 corresponds to the "secondary side first upper conductor part", and the first lower conductor part 212 corresponds to the "secondary side first lower conductor part".

As for each first circulation part 21, the first upper conductor part 211 and the first lower conductor part 212 are separated from each other in the axial direction s, as shown in FIGS. 13 and 14. The first upper conductor part 211 and the first lower conductor part 212 respectively extend, as shown in FIG. 9, from an inner periphery 51A of the first cylindrical part 5A toward an outer periphery 52A of the first cylindrical part 5A as seen in the axial direction s, and in the present embodiment, they have a band-like shape tapering as they extend from the outer periphery 52A toward the inner periphery 51A. Note that the more the number of turns of the secondary winding 2 (the number of the first circulation parts 21) gets, the less the degrees of tapering of the first upper conductor part 211 and the first lower conductor part 212 respectively get as seen in the axial direction s. The pair of first connection conductor parts 213 and 214 respectively extend, as shown in FIG. 13, from the first upper conductor part 211 in the axial direction s. The first connection conductor part 213 is connected to the first lower conductor part 212 of the same first circulation part 21. The first connection conductor part 214 is connected to the first lower conductor part 212 of the first circulation part 21 that is adjacent in the circumferential direction t. The pair of first connection conductor parts 213 and 214 are approximately perpendicular to the first upper conductor part 211 and the first lower conductor part 212, respectively. The first connection conductor part 213 is arranged on an inner periphery 51A side of the first cylindrical part 5A as seen in the axial direction s, and the first connection conductor part 214 is arranged on an outer periphery 52A side of the first cylindrical part 5A as seen in the axial direction s. The pair of first connection conductor parts 213 and 214 have circular columnar shapes as seen in the axial direction s.

In the present embodiment, as shown in FIG. 9, each first upper conductor part 211 is inclined in one sense of the circumferential direction t with respect to the radial direction u, and each first lower conductor part 212 is inclined in the other sense of the circumferential direction t with respect to the radial direction u. For instance, with respect to a radial direction u overlapped with each first connection conductor part 213, the first upper conductor part 211 connected to said first connection conductor 213 is inclined in the circumferential direction t clockwise, and the first lower conductor part 212 connected to said first connection conductor part 213 is inclined in the circumferential direction t anticlockwise. Like this, as the first upper conductor part 211 and the first lower conductor part 212 are inclined in the circumferential direction inversely with respect to the radial direction u, the pair of first connection conductor parts 213 and 214 can be formed respectively to extend in the axial direction s. Note that the more the number of turns of the secondary winding 2 (the number of first circulation parts 21) gets, the less the degrees of inclinations with respect to the axial direction u of each first upper conductor part 211 and each first lower conductor part 212 get.

Further, in the present embodiment, as shown in FIG. 9, each first upper conductor part 211 and the first upper conductor parts 111 adjacent to said first upper conductor part 211 on its both sides in the circumferential direction t are arranged so as to have a predetermined space in-between. The space is approximately the same on the inner periphery 51A side and on the outer periphery 52A side, for example. According to this arrangement, as seen in the axial direction s, each first upper conductor part 211 has the size on the inner periphery 51A side with respect to the circumferential direction t smaller than the size on the outer periphery 52A side with respect to the circumferential direction t. That is, as described above, each first upper conductor part 211 has a tapered shape as seen in the axial direction s. Likewise, each first lower conductor part 212 and the first lower conductor parts 112 adjacent to said first lower conductor part 212 on its both sides in the circumferential direction t are respectively arranged so as to have a predetermined space in-between. The space is approximately the same both on the inner periphery 51A side and on the outer periphery 52A side. According to this arrangement, as seen in the axial direction s, each first lower conductor part 212 has the size on the inner periphery 51A side with respect to the circumferential direction t smaller than the size on the outer periphery 52A side with respect to the circumferential direction t. That is, as described above, each first lower conductor part 212 has a tapered shape as seen in the axial direction s.

As for the plurality of first circulation parts 21, two first circulation parts 21 adjacent to each other in the circumferential direction t are directly connected to each other, and the induction current that flows in the secondary winding 2 runs in the plurality of first circulation part 21 in order. This time, the first connection conductor part 214 of each first circulation part 21 receives the induction current from the first lower conductor part 212 of the first circulation part 21 adjacent thereto in one sense of the circumferential direction t. Then, this induction current flows from the first connection conductor part 214 via the first upper conductor part 211 and the first connection conductor part 213 to the first lower conductor part 212. That is, in the example shown in FIG. 13, the induction current that flows in the respective first circulation parts 21 runs anticlockwise. Further, it is transmitted to the first circulation part 21 adjacent thereto in the other sense of the circumferential direction t. Likewise, the induction current of the secondary winding 2 circulates the plurality of first circulations parts 21 respectively. Note that the direction of the induction current that flows in each first circulation part 21 can be opposite to that of the above example. That is, the first lower conductor part 212 of each first circulation part 21 receives the induction current from the first connection conductor part 214 of the first circulation part 21 adjacent thereto in the other sense of the circumferential direction t. Further, this induction current flows from the first lower conductor part 212 via the first connection conductor part 213 and the first upper conductor part 211 to the first connection conductor part 214. That is, in the example shown in FIG. 13, the induction current that flows in the respective first circulation parts 21 may be configured to run clockwise. Note that the direction of the induction current that flows in the respective first circulation parts 21 is determined by the magnetic fields generated by each primary winding 1.

The plurality of second circulation parts 22 respectively have, for example, a rectangularly ring-like shape as seen in the circumferential direction t, as shown in FIG. 13. Each second circulation part 22 is positioned inside each first circulation part 21 as seen in the circumferential direction t, as shown in FIG. 13. The plurality of second circulation parts 22 are aligned in the circumferential direction t as seen in the axial direction s, as shown in FIGS. 10 and 11. Each second circulation part 22 is a part of the second cylindrical part 5B. The plurality of first circulation parts 21 and the plurality of second circulation parts 22 are aligned approximately alternatingly in the circumferential direction t, as seen in the axial direction s. Each of the plurality of second circulation parts 22 includes, as shown in FIGS. 10, 11, 13, and 14, a second upper conductor part 221, a second lower conductor part 222, and a pair of second connection conductor parts 223 and 224. The second upper conductor part 221 corresponds to the "secondary side second upper conductor part", and the second lower conductor part 222 corresponds to the "secondary side second lower conductor part".

As for each second circulation part 22, the second upper conductor part 221 and the second lower conductor part 222 are separated from each other in the axial direction s, as shown in FIGS. 13 and 14. The second upper conductor part 221 and the second lower conductor part 222 respectively extend, as shown in FIG. 11, from an inner periphery 51B of the second cylindrical part 5B toward an outer periphery 52B of the second cylindrical part 5B as seen in the axial direction s, and in the present embodiment, they have a band-like shape tapering as they extend from the outer periphery 52B toward the inner periphery 51B. Note that the more the number of turns of the secondary winding 2 (the number of the second circulation parts 22) gets, the less the degrees of tapering of the second upper conductor part 221 and the second lower conductor part 222 respectively get as seen in the axial direction s. The pair of second connection conductor parts 223 and 224 respectively extend, as shown in FIG. 13, from the second upper conductor part 221 in the axial direction s. The second connection conductor part 223 is connected to the second lower conductor part 222 of the same second circulation part 22. The second connection conductor part 224 is connected to the second lower conductor part 222 of the second circulation part 22 that is adjacent in the circumferential direction t. The pair of second connection conductor parts 223 and 224 are approximately perpendicular to the second upper conductor part 221 and the second lower conductor part 222, respectively. The second connection conductor part 223 is arranged on an inner periphery 51B side of the second cylindrical part 5B as seen in the axial direction s, and the second connection conductor part 224 is arranged on an outer periphery 52B side of the second cylindrical part 5B as seen in the axial direction s. The pair of second connection conductor parts 223 and 224 respectively have circular columnar shapes as seen in the axial direction s.

In the present embodiment, as shown in FIG. 11, each second upper conductor part 221 is inclined in one sense of the circumferential direction t with respect to the radial direction u, and each second lower conductor part 222 is inclined in the other sense of the circumferential direction t with respect to the radial direction u. For instance, with respect to the radial direction u overlapped with each second connection conductor part 223, the second upper conductor part 221 connected to said second connection conductor part 223 is inclined in the circumferential direction t clockwise, and the second lower conductor part 222 connected to said second connection conductor part 223 is inclined in the circumferential direction t anticlockwise. Like this, as the second upper conductor part 221 and the second lower conductor part 222 are inclined in the circumferential direction t inversely with respect to the radial direction u, the pair of second connection conductor parts 223 and 224 can be formed respectively to extend in the axial direction s. Note that the more the number of turns of the secondary winding 2 (the number of second circulation parts 22) gets, the less the degrees of inclinations with respect to the axial direction u of each second upper conductor part 221 and each second lower conductor part 222 get.

Further, in the present embodiment, as shown in FIG. 11, each second upper conductor part 221 and the second upper conductor parts 121 adjacent to said second upper conductor part 221 on its both sides in the circumferential direction t are arranged so as to have a predetermined space in-between. The space is approximately the same on the inner periphery 51B side and on the outer periphery 52B side, for example. According to this arrangement, as seen in the axial direction s, each second upper conductor part 221 has the size on the inner periphery 51B side with respect to the circumferential direction t smaller than the size on the outer periphery 52B side with respect to the circumferential direction t. That is, as described above, each second upper conductor part 221 has a tapered shape as seen in the axial direction s. Likewise, each second lower conductor part 222 and the second lower conductor parts 112 adjacent to said second lower conductor part 222 on its both sides in the circumferential direction t are arranged so as to have a predetermined space in-between. The space is approximately the same on the inner periphery 51B side and on the outer periphery 52B side, for example. According to this arrangement, as seen in the axial direction s, each second lower conductor part 222 has the size on the inner periphery 51B side with respect to the circumferential direction t smaller than the size on the outer periphery 52B side with respect to the circumferential direction t. That is, as described above, each second lower conductor part 22w has a tapered shape as seen in the axial direction s.

As for the plurality of second circulation parts 22, two second circulation parts 22 adjacent to each other in the circumferential direction t are directly connected to each other, and the induction current that flows in the secondary winding 2 runs in the plurality of second circulation parts 22 in order. This time, the second connection conductor part 224 of each second circulation part 22 receives the induction current from the second lower conductor part 222 of the second circulation part 22 adjacent thereto in one sense of the circumferential direction t. Then, this induction current flows from the second connection conductor part 224 via the second upper conductor part 221 and the second connection conductor part 223 to the second lower conductor part 222. That is, in the example shown in FIG. 13, the induction current that flows in the respective second circulation parts 22 runs anticlockwise. Therefore, the direction of the induction current that flows in each first circulation part 21 and the direction of the induction current that flows in each second circulation part 22 are the same, as seen in the circumferential direction t. Likewise, the induction current of the secondary winding 2 circulates the plurality of second circulation parts 22 respectively. Note that the direction of the induction current that flows in each second circulation part 22 can be opposite to that of the above example. That is, the second lower conductor part 222 of each second circulation part 22 receives the induction current from the second connection conductor part 224 of the second circulation part 22 adjacent thereto in the other sense of the circumferential direction t. Further, this induction current flows from the second lower conductor part 222 via the second connection conductor part 223 and the second upper conductor part 221 to the second connection conductor part 224. That is, in the example shown in FIG. 13, the induction current that flows in the respective second circulation parts 22 may be configured to run clockwise. Note that the direction of the induction current that flows in each first circulation part 21 and the direction of the induction current that flows in each second circulation part 22 are arranged to be the same with each other as seen in the circumferential direction t.

As for the secondary winding 2, one of the plurality of first circulation parts 21 and one of the plurality of second circulation parts 22 are connected. For example, the first upper conductor part 211 of one of the plurality of first circulation parts 21 and the second lower conductor part 222 of one of the plurality of second circulation parts 22 are connected, and they are conducted. This time, in the example shown in FIG. 13, one of the plurality of first circulation parts 21 and one of the plurality of second circulation parts 22 are connected, so that if the current that flows in the respective first circulation parts 21 runs anticlockwise, the current that flows in the respective second circulation parts 22 would also run anticlockwise, or, if the current that flows in the respective first circulation parts 21 runs clockwise, the current that flows in the respective second circulation parts 22 would also run clockwise. The secondary winding 2 is configured that the plurality of first circulation parts 21 are consecutively connected along the circumferential direction t, and the plurality of second circulation parts 22 are consecutively connected along the circumferential direction t. Further, as described above, one of the plurality of first circulation parts 21 and one of the plurality of second circulation parts 22 are connected, and therefore the induction current of the secondary winding 2 flows around the plurality of first circulation parts 21 and is thereafter input to the plurality of second circulation parts 22 to flow around the plurality of second circulation parts 22. In another embodiment, the secondary winding 2 may be configured that the respective first circulation parts 21 and the respective second circulation parts 22 are alternatingly connected, and the induction current of the secondary winding 2 flows the respective first circulation parts 21 and the respective second circulation parts 22 alternatingly.

In the air-core transformer B1, as shown in FIGS. 8 and 9, the plurality of first circulation part groups 110 (the plurality of primary windings 1) and the plurality of first circulation parts 21 (the secondary winding 2) are aligned alternatingly in the circumferential direction t, and constitute the first cylindrical part 5A. Further, as shown in FIGS. 10 and 11, the plurality of second circulation part groups 120 (the plurality of primary windings 1) and the plurality of second circulation parts 22 (the secondary winding 2) are aligned alternatingly in the circumferential direction t, and constitute the second cylindrical part 5B. The second cylindrical part 5B is located inside the first cylindrical part 5A.

As for the air-core transformer B1, as shown in FIGS. 8 and 9, the first upper conductor part 111 and the first lower conductor part 112 of each primary winding 1 respectively have sizes with respect to the circumferential direction t smaller than those of the first upper conductor part 211 and the second lower conductor part 222 of the secondary winding 2, as seen in the axial direction s. Further, as shown in FIGS. 10 and 11, the second upper conductor part 121 and the second lower conductor part 122 of each primary winding 1 respectively have sizes with respect to the circumferential direction t smaller than those of the second upper conductor part 221 and the second lower conductor part 222 of the secondary winding 2, as seen in the axial direction s.

As for the air-core transformer B1, as shown in FIG. 14, the respective first circulation part groups 110 of the plurality of primary windings 1 and the respective first circulation parts 21 of the secondary winding 2 are overlapped with each other as seen in the circumferential direction t. That is, as seen in the circumferential direction t, the respective first upper conductor parts 111 of the respective primary windings 1 and the respective first upper conductor parts 211 are overlapped with each other, the respective first lower conductor parts 112 of the respective first primary windings 1 and the respective first lower conductor parts 212 are overlapped with each other, the respective first connection conductor parts 113 of the respective primary windings 1 and the respective first connection conductor parts 213 are overlapped with each other, and the respective first connection conductor parts 114 of the respective primary windings 1 and the respective first connection conductor parts 214 are overlapped with each other. Further, as shown in FIG. 14, the respective second circulation part groups 120 of the plurality of primary windings 1 and the respective second circulation parts 22 of the secondary winding 2 are overlapped with each other as seen in the circumferential direction t. That is, as seen in the circumferential direction t, the respective second upper conductor parts 121 of the respective primary windings 1 and the respective second upper conductor parts 221 are overlapped with each other, the respective second lower conductor parts 122 of the respective primary windings 1 and the respective second lower conductor parts 222 are overlapped with each other, the respective second connection conductor parts 123 of the respective primary windings 1 and the respective second connection conductor parts 223 are overlapped with each other, and the respective second connection conductor parts 124 of the respective primary windings 1 and the respective second connection conductor parts 224 are overlapped with each other.

As for the air-core transformer B1, as shown in FIGS. 14 and 15, the respective first circulation part groups 110 of the plurality of primary wirings 1 and the respective second circulation parts 22 of the secondary winding 2 are partially overlapped as seen in the axial direction s, and are at the same time partially overlapped as seen in the radial direction u. That is, as seen in the axial direction s, the first upper conductor parts 111 of the respective primary windings 1 and the respective second upper conductor parts 221 are overlapped with each other, and the first lower conductor parts 112 of the respective primary windings 1 and the respective second lower conductor parts 222 are overlapped with each other. As seen in the radial direction u, the respective first connection conductor parts 113 of the respective primary windings 1 and the respective second connection conductor parts 223 are overlapped with each other, and the respective first connection conductor parts 114 of the respective primary windings 1 and the respective second connection conductor parts 224 are overlapped with each other. Further, as shown in FIGS. 14 and 16, the respective second circulation part groups 120 of the plurality of primary windings 1 and the respective first circulation parts 21 of the secondary winding 2 are partially overlapped as seen in the axial direction s, and are at the same time partially overlapped as seen in the radial direction u. That is, as seen in the axial direction s, the respective second upper conductor parts 121 of the respective primary windings 1 and the respective first upper conductor parts 211 are overlapped with each other, and the second lower conductor parts 122 of the respective primary windings 1 and the respective first lower conductor parts 212 are overlapped with each other. As seen in the radial direction u, the respective second connection conductor parts 123 of the respective primary windings 1 and the respective first connection conductor parts 213 are overlapped with each other, and the respective second connection conductor parts 124 of the respective primary windings 1 and the respective first connection conductor parts 214 are overlapped with each other.

As described above, the air-core transformer B1 is formed by the wiring pattern of the plurality of wiring layers 7 and the plurality of through electrodes 79, and the relationship between the respective parts of the air-core transformer B1 and the wiring pattern of the respective wiring layers 7 are as follows. According to the wiring pattern of the first wiring layer 71, the plurality of first upper conductor parts 111 (the respective first circulation parts 11 of the respective primary windings 1) and the plurality of first upper conductor parts 211 (the respective first circulation parts 21 of the secondary winding 2) are formed. According to the wiring pattern of the second wiring layer 72, the plurality of second upper conductor parts 121 (the respective second circulation parts 12 of the respective primary windings 1) and the plurality of second upper conductor parts 221 (the respective second circulation parts 22 of the secondary winding 2) are formed. According to the wiring pattern of the third wiring layer 73, the plurality of second lower conductor parts 122 (the respective second circulation parts 12 of the respective primary windings 1) and the plurality of second lower conductor parts 222 (the respective second circulation parts 22 of the secondary winding 2) are formed. According to the wiring pattern of the fourth wiring layer 74, the plurality of first lower conductor parts 112 (the respective first circulation parts 11 of the respective primary windings 1) and the plurality of first lower conductor parts 212 (the respective first circulation parts 21 of the secondary winding 2) are formed. Further, according to the through electrodes 79 that conduct the first wiring layer 71 and the fourth wiring layer 74, the plurality of first connection conductor parts 113 and 114 (the respective first circulation parts 11 of the respective primary windings 1) and the plurality of first connection conductors 213 and 214 (the respective first circulation conductor parts 21 of the secondary winding 2) are formed, and according to the through electrodes 79 that conduct the second wiring layer 72 and the third wiring layer 73, the plurality of second connection conductor parts 123 and 124 (the respective second circulation parts 12 of the respective primary windings 1) and the plurality of second connection conductor parts 223 and 224 (the respective second circulation parts 22 of the secondary winding 2) are formed.

The operational effects of the driving circuit A1 and the control board D1 of the present disclosure are as follows.

The driving circuit A1 is provided with the air-core transformer B1, and the air-core transformer B1 has the plurality of primary windings 1 and the secondary winding 2 magnetically coupled to each of the plurality of primary windings 1. An AC signal is input to each of the plurality of primary windings 1. According to this configuration, due to the AC signal input to the respective primary windings 1, a magnetic field is generated from the respective primary windings 1. Further, in the secondary winding 2 the induction current is generated by the magnetic field generated from the respective primary windings 1, and a signal according to the induction current is output. This time, the magnetic fields generated by the respective primary windings 1 are synthesized by being mutually intensified or cancelled, and in the secondary winding 2 an induction current is generated by this synthesized magnetic fields. Thus, by adjusting the amplitudes (maximum values) of the respective AC signals input to each of the plurality of primary windings 1, the ratios between the period to have a positive value and the period to have a negative value within one whole cycle for the respective AC signals, and the phases as appropriate to thereby adjust the magnetic fields generated by the respective primary windings 1, various synthesized magnetic fields can be generated. As such, an output signal (output voltage) output from the secondary winding 2 can be adjusted in various manners. That is, the driving circuit A1 can adjust the switching operation of the switching element Q with a high degree of freedom.

Figure 17:
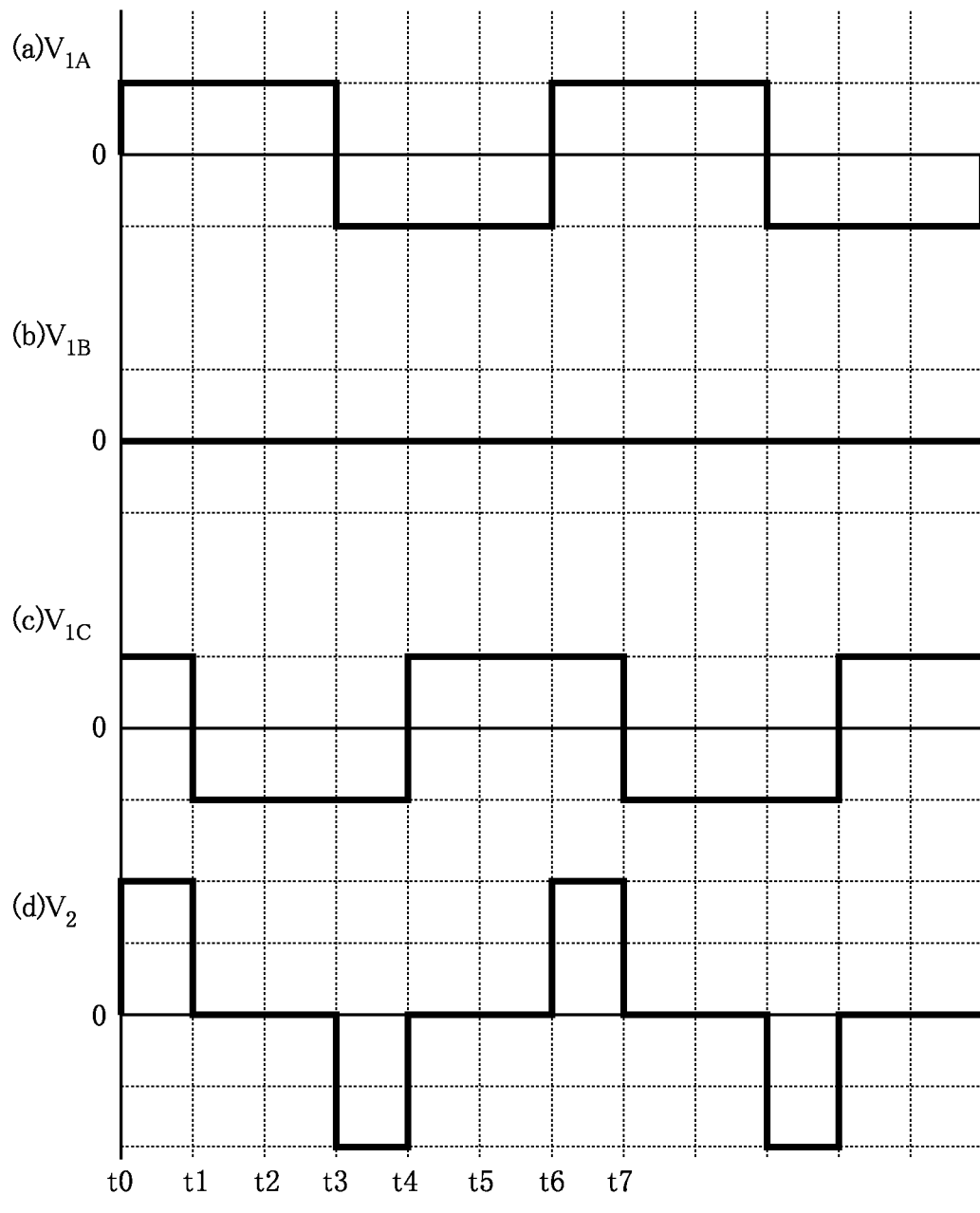
FIG. 17 is a waveform chart illustrating another operation example of the driving circuit of the present disclosure.
Figure 18:
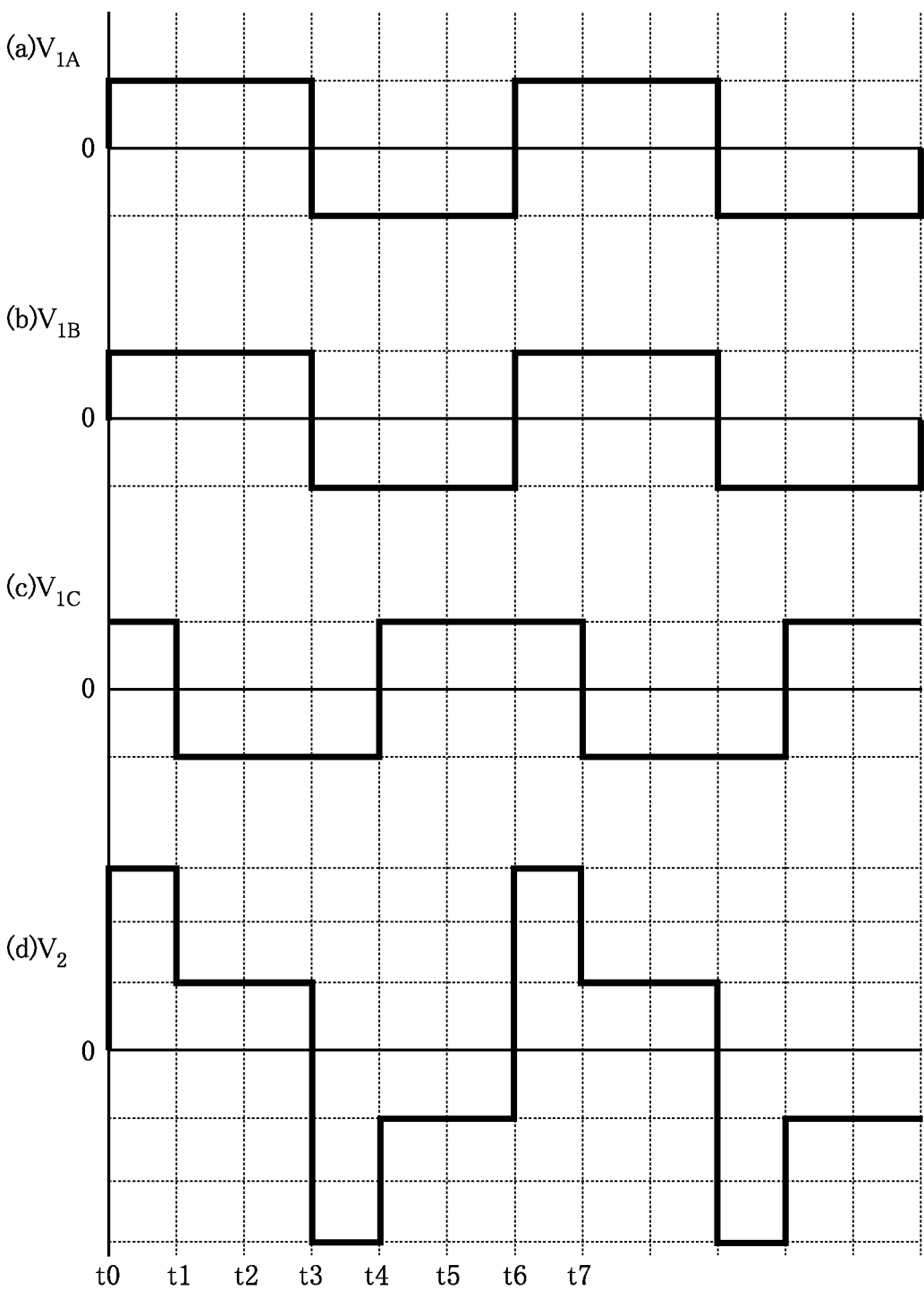
FIG. 18 is a waveform chart illustrating another operation example of the driving circuit of the present disclosure.

For instance, FIGS. 17 and 18 illustrate another operation example of the driving circuit A1. The waveform charts shown in FIGS. 17 and 18 correspond to the waveform chart shown in FIG. 2. The operation example shown in FIG. 17 is different from the operation example of FIG. 2 in that the AC voltage $V_{1B}$ is 0V and no current runs in the primary winding 1B. By inputting the AC voltages $V_{1A}$ to $V_{1C}$ like this to the respective primary windings 1A-1C, a period in which the voltage is 0V is added to the output voltage $V_2$ output from the secondary winding 2, between the period to have a positive value and the period to have a negative value, as shown in FIG. 17. Whereas, the operation example shown in FIG. 18 is different from the operation example of FIG. 2 in that the phase of the AC voltage $V_{1B}$ and the phase of the AC voltage $V_{1A}$ are the same. By inputting the AC voltages $V_{1A}$ to $V_{1C}$ like this to the respective primary windings 1A-1C, regarding the output voltage $V_2$ output from the secondary winding 2, the amplitude (maximum value) becomes large temporarily at the timing where the period to have a positive value and the period to have a negative value is switched from each other, as shown in FIG. 18. Therefore, as shown in FIGS. 2, 17 and 18, it can be seen that the output signal (output voltage) output from the secondary winding 2 can be adjusted variously. Thus, the driving circuit A1 can adjust the switching operation of the switching element Q with a high degree of freedom.

On the driving circuit A1, the air-core transformer B1 has the plurality of primary windings 1. Further, the respective AC signals (the respective AC voltages) input to the respective primary windings 1 have the same cycle (frequency) and amplitude (maximum value), and are rectangular waves where the ratio of the period to have a positive value and the period to have a negative value in one whole cycle is 50:50 and their length are the same to each other. Further, assuming that the number of turns of the primary winding 1 is n, the respective AC signals (respective AC voltages) input to the respective primary windings 1 have phases different from each other by $2\pi/n$. According to this configuration, the frequency of the output signal output from the secondary winding 2 can be made n times as large as the frequencies of the respective AC signals input to the respective primary windings 1. For example, as shown in FIG. 2, in the configuration where the air-core transformer B1 has three primary windings 1, by differentiating the phases of the respective AC signals by 120 degrees ($=2\pi/3$) from one another, the frequency of the output signal (output voltage) output from the secondary winding 2 can be made three times as large as the frequencies of the respective AC signals (the respective voltages) input to the respective primary windings 1. Therefore, the driving circuit A1 can make the frequency of the driving signal output to the switching element Q equal to or larger than the frequency which the respective ICs 3 of the control part C1 can output. In particular, if the number of the primary windings 1 is an odd number, the frequency of the output signal output from the secondary winding 2 can be made odd number times as large as the frequencies of the respective AC signals input to the respective primary windings 1.

The air-core transformer B1 of the driving circuit A1 is provided with the plurality of primary windings 1 in each of which an input current from the outside runs. The respective primary windings 1 include a plurality of first circulation parts 11 each of which is ring-like as seen in the circumferential direction t. According to this configuration, in the respective first circulation parts 11, for example, the input current that flows at one point flows in an opposite direction at another point being faced by the one point in the axial direction s. Therefore, the respective magnetic fluxes generated by those points are oriented in the directions opposite to each other outside the respective first circulation parts 11, and they cancel each other. The plurality of circulation parts 11 are a part of the first cylindrical part 5A which gives the external appearance of the air-core transformer B1. Therefore, as for the air-core transformer B1, the magnetic flux outside the respective first circulation parts 11 (the first cylindrical part 5A) decreases, and a leakage of the magnetic flux to the outside can be suppressed.

In the air-core transformer B1, the plurality of primary windings 1 respectively include the plurality of first circulation parts 11 and the plurality of second circulation parts 12. The direction of the input current flowing in each of the plurality of first circulation parts 11 and the direction of the input current flowing in each of the plurality of second circulation parts 12 are the same as seen in the circumferential direction t. According to this configuration, the magnetic flux generated by the input current flowing in each of the plurality of first circulation parts 11 and the magnetic flux generated by the input current flowing in each of the plurality of second circulation parts 12 are oriented in the same direction and are intensified with each other, inside the plurality of second circulation parts 12, that is, inside the second cylindrical part 5B. Therefore, the air-core transformer B1 can improve the inductance value as the magnetic flux inside the second cylindrical part 5B increases.

The air-core transformer B1 is not provided with a magnetic substance core with respect to the respective primary windings 1 and the secondary winding 2, and has an air-core. As for a transformer provided with the magnetic substance core, if the input current input to the respective primary windings 1 is in a high-frequency band, the magnetic substance core causes an energy loss. Therefore, even if the input current input to the respective primary windings is in the high-frequency band, the air-core transformer B1 can suppress the energy loss due to the magnetic substance core, as it has no magnetic substance core.

As for the air-core transformer B1, the respective first circulation part groups 110 of the plurality of primary windings 1 (the plurality of first circulation parts 11 of the respective primary windings 1) and the plurality of first circulation parts 21 of the secondary winding 2 are aligned alternatingly in the circumferential direction t. Further, inside the respective first circulation part groups 110 (the respective first circulation parts 11 of a primary winding 1) of the plurality of primary windings 1, the respective second circulation parts 22 of the secondary winding 2 are arranged, and inside the respective first circulation parts 21 of the secondary winding 2, the respective second circulation part groups 120 of the plurality of primary windings 1 (the respective second circulation parts 12 of the respective primary windings 1) are arranged. According to this configuration, the coupling between the respective primary windings 1 and the secondary winding 2 becomes favorable. Thus, the leakage of the magnetic flux due to the defective coupling between the respective primary windings 1 and the secondary winding 2 can be suppressed.

The control board D1 is provided with the wiring substrate E1, and the wiring substrate E1 is provided with a plurality of wiring layers 7. The plurality of wiring layers 7 include the first wiring layer 71, the second wiring layer 72, the third wiring layer 73, and the fourth wiring layer 74 that are laminated in the axial direction s. A wiring pattern is formed in each of the first wiring layer 71, the second wiring layer 72, the third wiring layer 73, and the fourth wiring layer 74, and by these wiring patterns the air-core transformer B1 is constituted. According to this configuration, by the manufacturing process of, for example, a printed substrate (or a semiconductor substrate or a ceramic substrate)

the air-core transformer B1 is formed. Thus, the wiring substrate E1 facilitates the manufacturing of the air-core transformer B1 that is a complicated wiring structure. Further, as the wiring substrate E1 constitutes the air-core transformer B1 by the wiring patterns in the plurality of wiring layers 7, height-reduction of the air-core transformer B1 is enabled.

Figure 19:
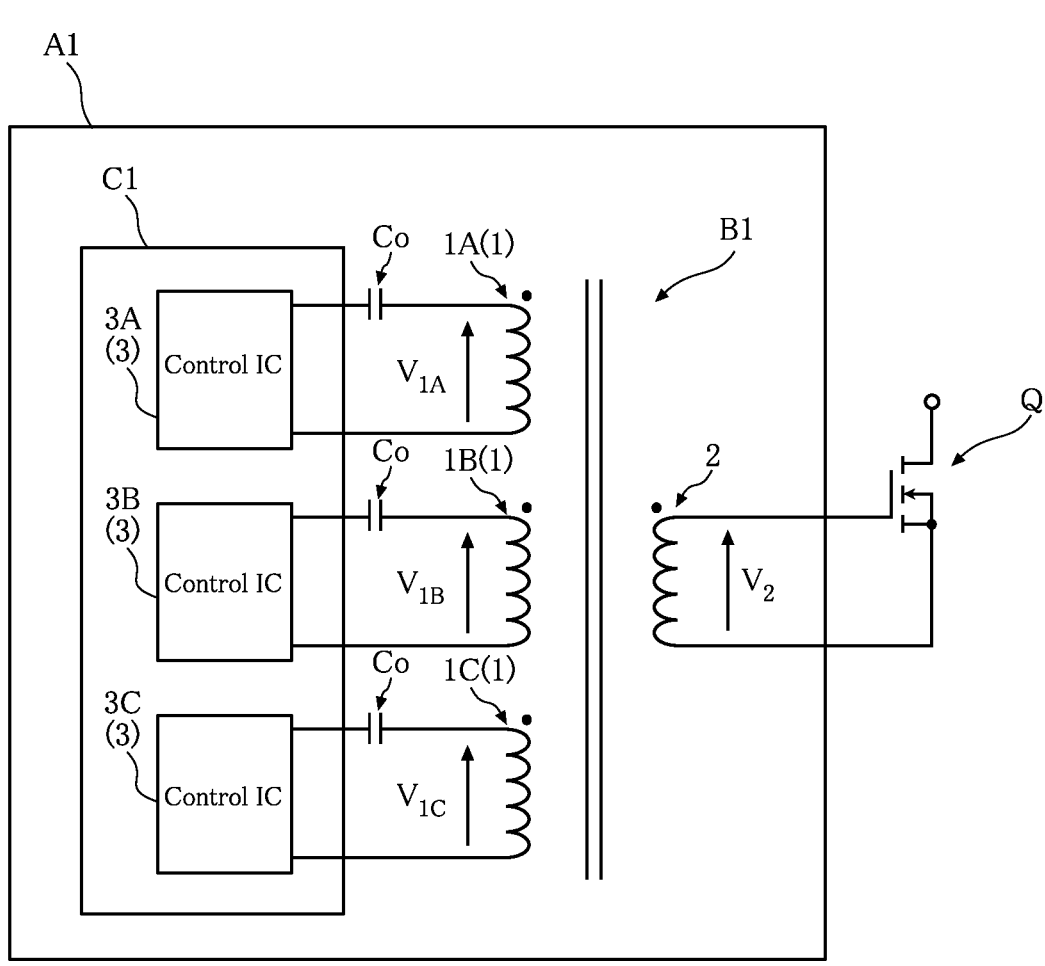
FIG. 19 is a circuit diagram illustrating another example of a circuit configuration of the driving circuit of the present disclosure.

In the above embodiments, there is a case where a DC bias is added to a control signal output from the respective control ICs 3, for example. In such a case, as shown in FIG. 19, for example, it is advisable to add a capacitor Co between each control IC 3 and each primary winding 1. In other words, in a case where the DC bias is not added to the control signal output from the each control IC 3, the capacitor Co is not necessary as in the above embodiment.

Figure 20:
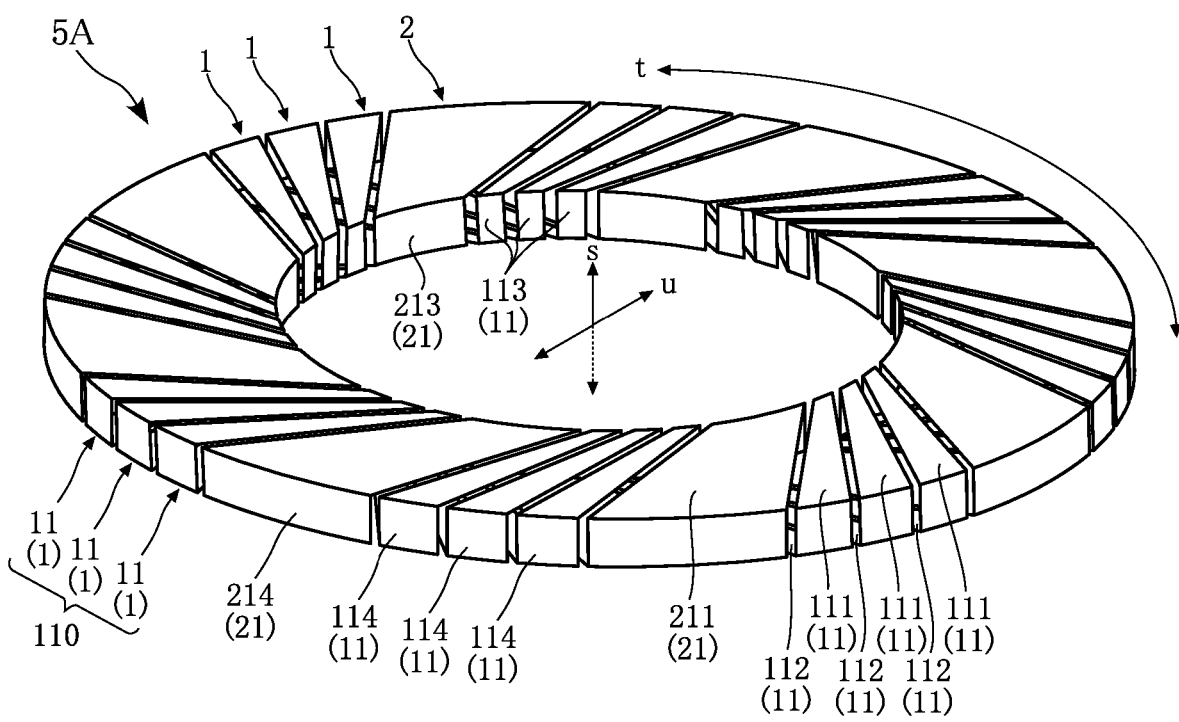
FIG. 20 is a perspective view illustrating a first cylindrical part according to a variation of the present disclosure.

As for the above embodiments, the example is shown where the pair of the first connection conductor parts 113 and 114 in the respective first circulation parts 11 of the respective primary windings 1 are constituted by the respective through electrodes 79 and have approximately circular columnar shapes in a plan view, but this is not limiting. The pair of the first connection conductor parts 113 and 114 may be band-like as seen in the radial direction u from the outer side toward the inner side, as shown in FIG. 20. Further, the pair of first connection conductor parts 213 and 214 in the respective first circulation parts 21 of the secondary winding 2 may also be, as shown in FIG. 20, band-like as seen in the radial direction u from the outer side toward the inner side. Further, the same can be said as for the pair of second connection conductor parts 123 and 124 in the respective second circulation parts 12 of the respective primary windings 1 and the pair of second connection conductor parts 223 and 224 in the respective second circulation parts 22 of the secondary winding 2.

As for the above embodiments, the example is shown where the numbers of turns of the respective primary windings 1 are the same, but this is not limiting. Meanwhile, if the number of turns is to be changed, the amplitude of the AC voltage input to the respective primary windings 1 is adjusted as appropriate, so that the voltage transmitted from the respective primary windings 1 to the secondary winding 2 would be the same. For example, it is sufficient that the ratio between the numbers of turns of the plurality of primary windings 1 and the number of turns of the secondary winding 2 is set as $N_{1A}:N_{1B}:N_{1C}:N_2=3:5:1:1$, and in the case where the output voltage of the secondary winding 2 is set as 1V, it is sufficient that the AC voltage input to the primary winding 1A is set as 3V, the AC voltage input to the primary winding 1B is set as 5V, and the AC voltage input to the primary winding 1C is set as 1V.

As for the above embodiments, the example is shown where as for the air-core transformer B1, the plurality of primary windings 1 and the secondary winding 2 are respectively wound in a toroidal shape, but this is not limiting. For example, the plurality of primary windings 1 and the secondary winding 2 may respectively be wound in a spiral shape, and may respectively be wound in a solenoidal shape. Note that in the present disclosure, the solenoidal shape is a shape whose planar shape is not ring-like as the toroidal shape, and in a plan view, it includes those wound like a curved line in a plan view in addition to those wound like a straight line in a plan view. Regarding these variations, explanations are given below with reference to FIGS. 21-24.

Figure 21:
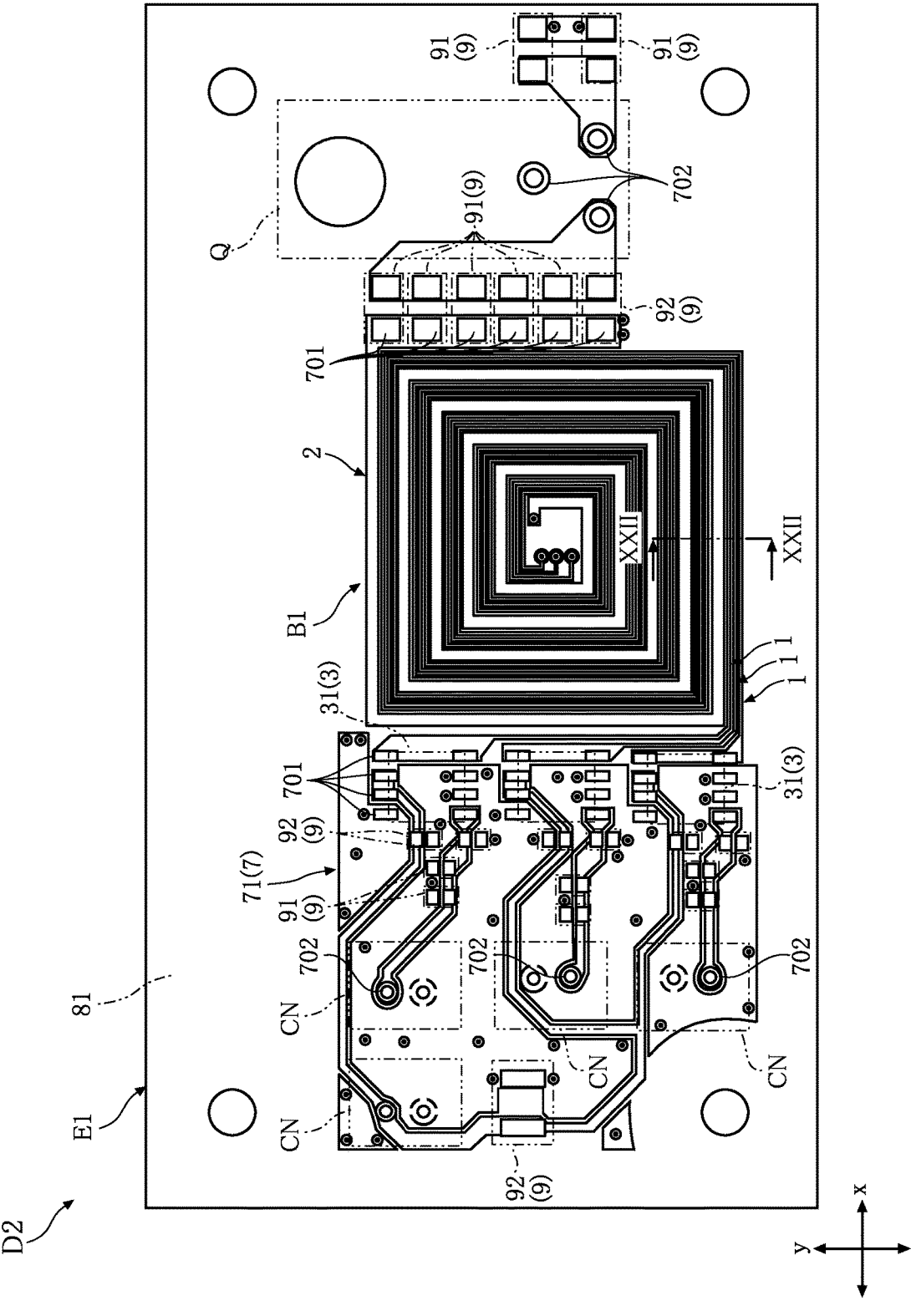
FIG. 21 is a plan view illustrating a control board according to a variation of the present disclosure.
Figure 22:
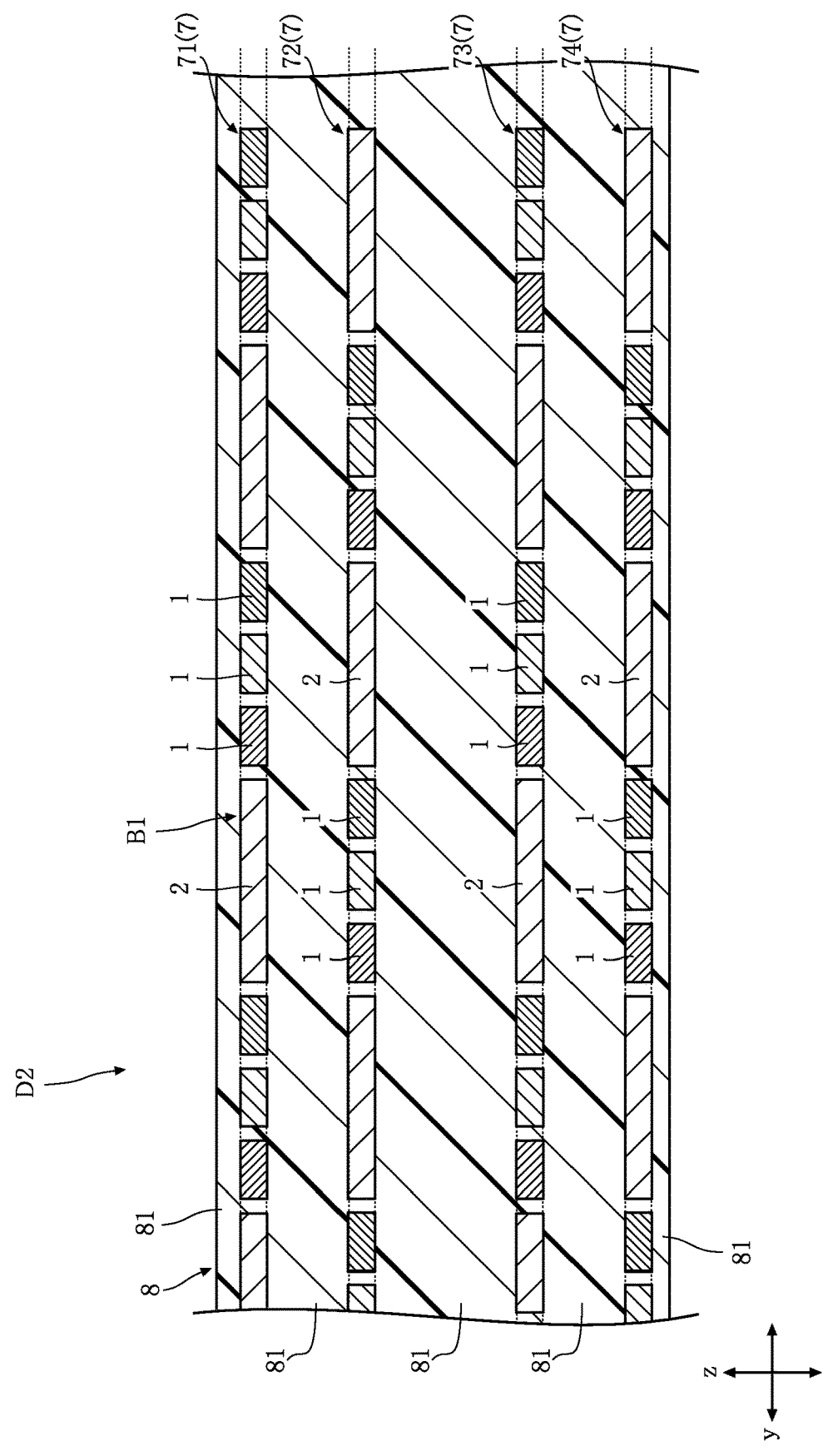
FIG. 22 is a schematic sectional view illustrating the control board shown in FIG. 21, which is a schematic view of a cross section along line XXII-XXII of FIG. 21.

FIGS. 21 and 22 illustrate the control board D2 according to a variation. FIG. 21 is a plan view that illustrates the control board D2. FIG. 22 is a schematic sectional view that illustrates the control board D2, and schematically shows the cross section along line XXII-XXII of FIG. 21. Around the air-core transformer B1 of the control board D2, as shown in FIGS. 21 and 22, the plurality of primary windings 1 and the secondary winding 2 are respectively wound in a spiral shape. As shown in FIG. 21, in a plan view, the respective wiring layers 7 are patterned spirally, to thereby configure the plurality of primary windings 1 and the secondary winding 2 respectively. This time, the plurality of primary windings 1 and the secondary winding 2 are arranged alternatingly. Further, as shown in FIG. 22, the plurality of primary windings 1 and the secondary winding 2 are aligned alternatingly in the z-direction.

Figure 23:
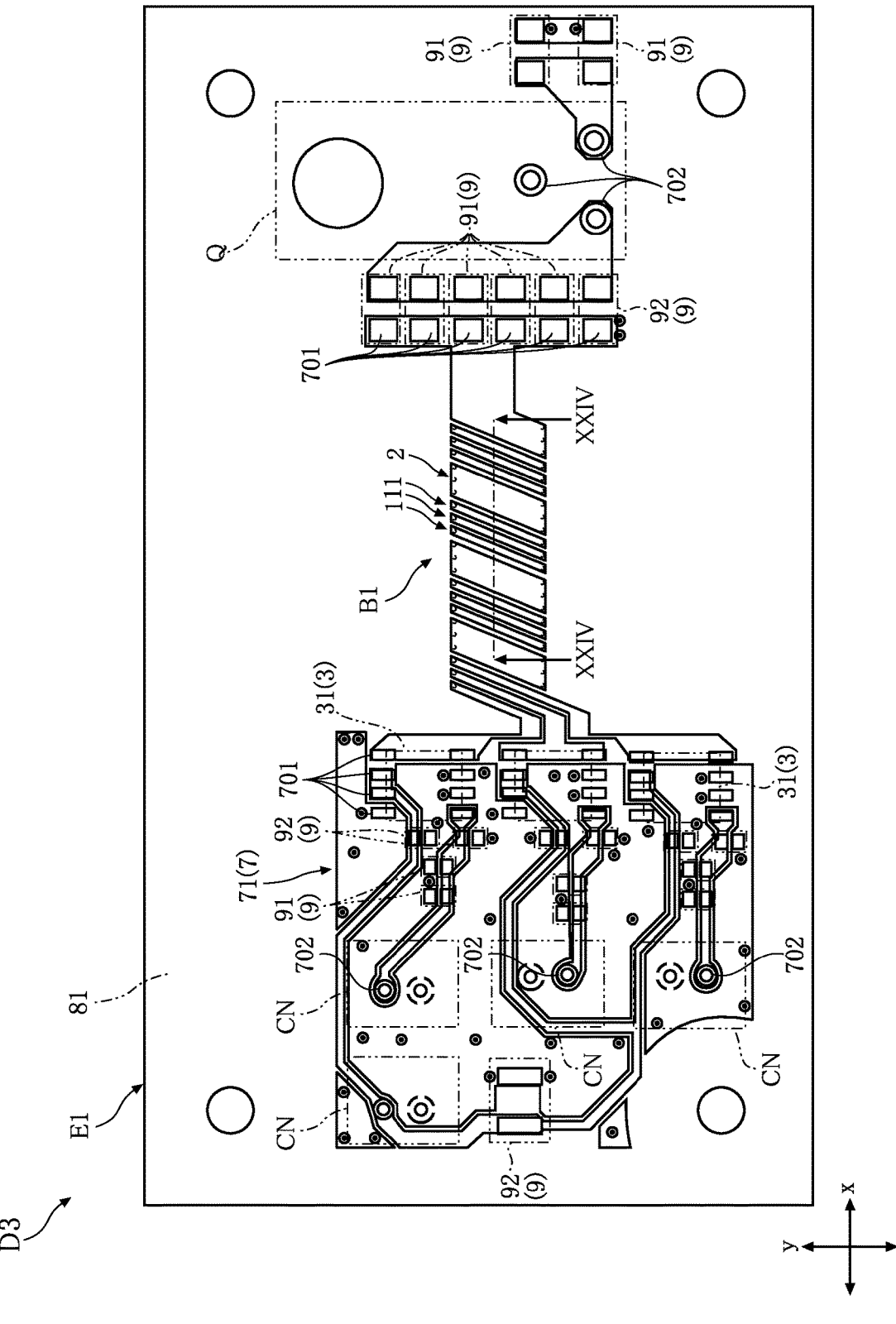
FIG. 23 is a plan view illustrating a control board according to a variation of the present disclosure.
Figure 24:
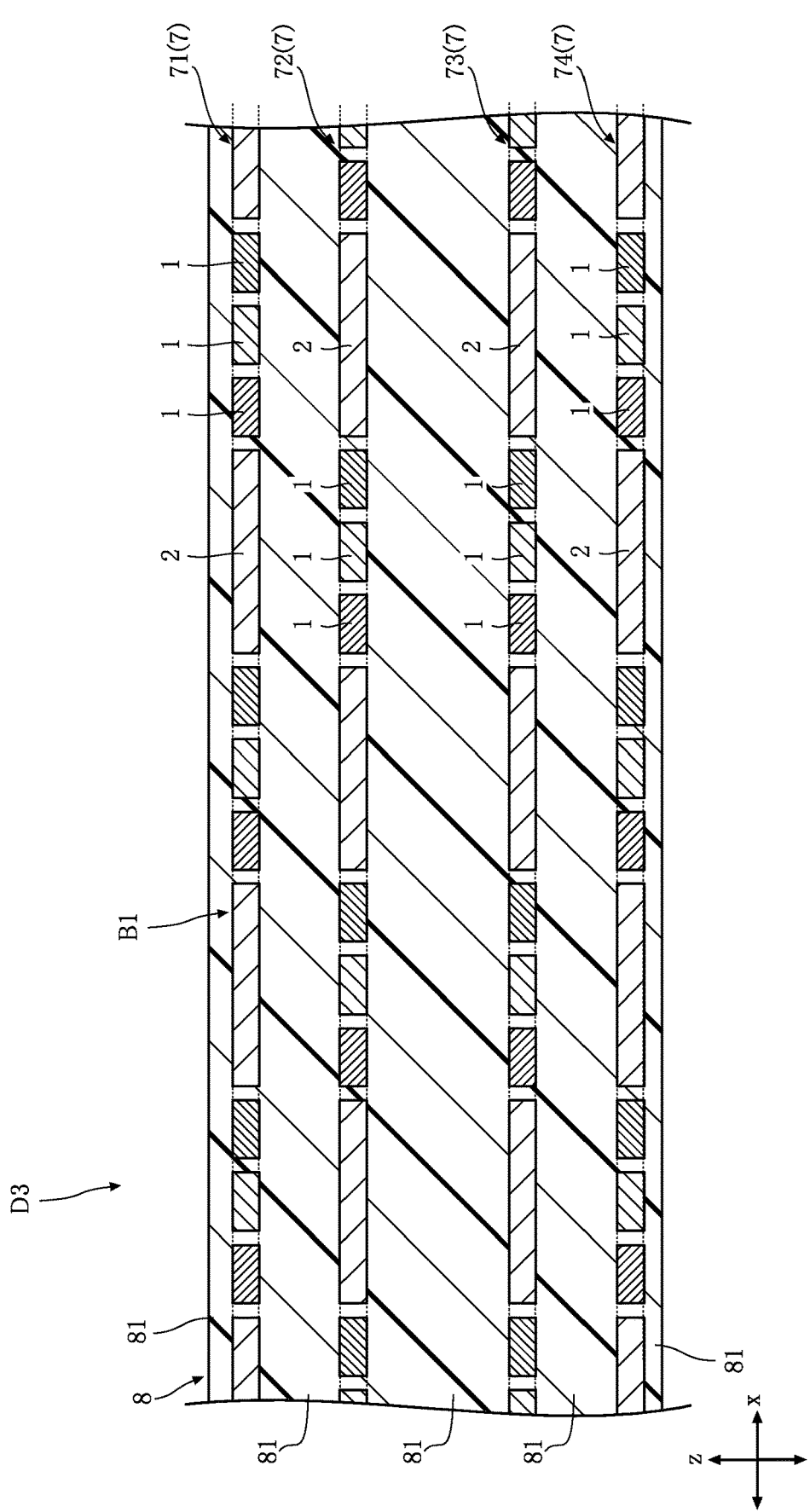
FIG. 24 is a schematic sectional view illustrating the control board shown in FIG. 23, which is a schematic view of a cross section along line XXIV-XXIV of FIG. 22.

FIGS. 23 and 24 illustrate the control board D3 according to a variation. FIG. 23 is a plan view illustrating the control board D3. FIG. 24 is a schematic sectional view illustrating the control board D3, and schematically shows the cross section along line XXIV-XXIV of FIG. 23. Around the air-core transformer B1 of the control board D3, as shown in FIGS. 23 and 24, the plurality of primary windings 1 and the secondary winding 2 are respectively wound in a solenoidal shape. In the air-core transformer B1, the plurality of primary windings 1 and the secondary winding 2 are formed ring-like with a common central axis, as seen in the x-direction. Further, the plurality of primary windings 1 respectively include the plurality of first circulation parts 11 and the plurality of second circulation parts 12, and the secondary winding 2 is configured to include the plurality of first circulation parts 21 and the plurality of second circulation parts 22. The plurality of first circulation parts 11 of the respective primary windings 1, the plurality of second circulation parts 12 of the respective primary windings 1, the plurality of first circulation parts 21 of the secondary winding 2 and the plurality of second circulation parts 22 of the secondary winding 2 are aligned in the x-direction in a plan view. This time, the plurality of primary windings 1 and the secondary winding 2 are alternatingly aligned.

Even in those variations, that is, the case where the plurality of primary windings 1 and the secondary winding 2 are respectively wound in a spiral shape (see FIGS. 21 and 22) or a solenoidal shape (see FIGS. 23 and 24), as in the case where they are wound in a toroidal shape, the leakage of the magnetic flux to the outside can be suppressed. Note however that the case where the plurality of primary windings 1 and the secondary winding 2 are wound in a toroidal shape is more preferable than the case where they are wound in a spiral shape or a solenoid shape, in suppressing the leakage of the magnetic flux. Further, even when the plurality of primary windings 1 and the secondary winding 2 respectively wound in a spiral shape (see FIGS. 21 and 22) or in a solenoidal shape (see FIGS. 23 and 24), by alternatingly winding the plurality of primary windings 1 and the secondary winding 2, the coupling between the respective primary windings 1 and the secondary winding 2 becomes favorable, and the leakage of the magnetic flux due to defective coupling between the respective primary windings 1 and the secondary winding 2 can be suppressed.

As for the above embodiments, the example is shown where the air-core transformer B1 is constituted by the wiring pattern of the plurality of wiring layers 7 of the wiring substrate E1 and the plurality of through electrodes 79, but this is not limiting. For example, the plurality of primary windings 1 and the secondary winding 2 may be formed by winding a lead line that is linear or board-like. The air-core transformer B1 configured this way is mounted on the wiring substrate E1, for example.

As for the above embodiments, the example is shown where the output voltage output from the secondary winding 2 is input as the driving signal to the switching element Q, but this is not limiting. A predetermined circuit (e.g., a rectifier circuit, a filter circuit, and a signal inversion circuit) may be connected between the secondary winding 2 and the switching element Q.

The driving circuit and the control board according to the present disclosure are not limited to the above-described embodiments. The specific configurations of the respective parts of the driving circuit and the control board of the present disclosure can be subjected to various design changes. The present disclosure includes embodiments described by the following clauses:

Clause 1.

A driving circuit for controlling driving of a switching element by outputting a driving signal to the switching element, comprising an air-core transformer having a plurality of primary windings and a secondary winding magnetically coupled to each of the plurality of primary windings, wherein an AC signal is input to each of the plurality of primary windings of the air-core transformer, the plurality of primary windings comprise a first primary winding and a second primary winding, and there is a phase difference between an AC signal input to the first primary winding and an AC signal input the second primary winding.

Clause 2.

The driving circuit according to clause 1, wherein if a number of the primary windings is n (n is a natural number), phases of AC signals input to each of the n primary windings are different from one another by $2\pi/n$.

Clause 3.

The driving circuit according to clause 2, wherein a number of the primary windings is an odd number.

Clause 4.

The driving circuit according to any one of clauses 1-3, wherein an AC signal input to each of the plurality of primary windings is an AC voltage where a period to have a positive value and a period to have a negative value in one cycle are same to each other.

Clause 5.

The driving circuit according to any one of clauses 1-4, wherein respective numbers of turns of the plurality of primary windings are same to one another.

Clause 6.

The driving circuit according to clause 5, wherein respective numbers of turns of the plurality of primary windings and a number of turns of the secondary winding are same to one another.

Clause 7.

The driving circuit according to any one of clauses 1-6, wherein the plurality of primary windings and the secondary winding are alternatingly wound.

Clause 8.

The driving circuit according to clause 7, wherein each of the plurality of primary windings and the secondary winding are wound in a toroidal shape.

Clause 9.

The driving circuit according to clause 8, wherein each of the plurality of primary windings comprises a plurality of primary side first circulation parts and a plurality of primary side second circulation parts, each primary side first circulation part being ring-like as seen in a toroidal direction, each primary side second circulation part being ring-like as seen in the toroidal direction, the secondary winding comprises a plurality of secondary side first circulation parts and a plurality of secondary side second circulation parts, each secondary side first circulation part being ring-like as seen in the toroidal direction, each secondary side second circulation part being ring-like as seen in the toroidal direction, the plurality of primary side first circulation parts of each of the plurality of primary windings and the plurality of secondary side first circulation parts are aligned in the toroidal direction and constitute a first cylindrical part, the plurality of primary side second circulation parts of each of the plurality of primary windings and the plurality of secondary side second circulation parts are aligned in the toroidal direction and constitute a second cylindrical part, and the second cylindrical part is located inside the first cylindrical part as seen in the toroidal direction.

Clause 10.

The driving circuit according to clause 9, wherein as for the first cylindrical part, the primary side first circulation parts of each of the plurality of primary windings are respectively arranged adjacent to one another in the toroidal direction and constitute a plurality of primary side first circulation part groups, and the plurality of primary side first circulation groups and the plurality of secondary side first circulation parts are alternatingly aligned in the toroidal direction.

Clause 11.

The driving circuit according to clause 10, wherein as for the second cylindrical part, the primary side second circulation parts of each of the plurality of primary windings are respectively arranged adjacent to one another in the toroidal direction and constitute a plurality of primary side second circulation part groups, and the plurality of primary side second circulation groups and the plurality of secondary side second circulation parts are alternatingly aligned in the toroidal direction.

Clause 12.

The driving circuit according to clause 11, wherein each of the plurality of primary side first circulation part groups and each of the plurality of secondary side second circulation parts are overlapped with each other as seen in an axial direction in which a central axis of the toroidal direction extends, and each of the plurality of primary side second circulation part groups and each of the plurality of secondary side first circulation parts are overlapped with each other as seen in the axial direction.

Clause 13.

The driving circuit according to clause 12, as for each of the plurality of primary windings, each of the plurality of primary side first circulation parts comprises a primary side first upper conductor part and a primary side first lower conductor part separated from each other in an axial direction in which a central axis of the toroidal direction extends, as for each of the plurality of primary windings, each of the plurality of primary side second circulation parts comprises a primary side second upper conductor part and a primary side second lower conductor part separated from each other in the axial direction, as for the secondary winding, each of the plurality of secondary side first circulation parts comprises a secondary side first upper conductor part and a secondary side first lower conductor part separated from each other in the axial direction, and as for the secondary winding, each of the plurality of secondary side second circulation parts comprises a secondary side second upper conductor part and a secondary side second lower conductor part separated from each other in the axial direction.

Clause 14.

The driving circuit according to clause 13, wherein the primary side first upper conductor part and the primary side first lower conductor part in each of the plurality of primary windings and the secondary side first upper conductor part and the secondary side first lower conductor part in the secondary winding respectively have a band-like shape extending from an inner periphery of the first cylindrical part to its outer periphery, as seen in an axial direction in which a central axis of the toroidal direction extends.

Clause 15.

The driving circuit according to clause 14, wherein the primary side first upper conductor part and the primary side first lower conductor part in each of the plurality of primary windings respectively have a size with respect to the toroidal direction smaller than those of the secondary side first upper conductor part and the secondary side first lower conductor part in the secondary winding, as seen in the axial direction.

Clause 16.

The driving circuit according to any one of clauses 13-15, wherein the primary side second upper conductor part and the primary side second lower conductor part in each of the plurality of primary windings, and the secondary side second upper conductor part and the secondary side second lower conductor part in the secondary winding respectively have a band-like shape extending from an inner periphery of the second cylindrical part to its outer periphery, as seen in the axial direction.

Clause 17.

The driving circuit according to clause 16, wherein the primary side second upper conductor part and the primary side second lower conductor part in each of the plurality of primary windings respectively have a size with respect to the toroidal direction smaller than those of the secondary side second upper conductor part and the secondary side second lower conductor part in the secondary winding, as seen in the axial direction.

Clause 18.

A control board comprising the driving circuit according to any one of clauses 1-17, the control board comprising a wiring substrate carrying the air-core transformer inside, wherein the wiring substrate comprises a plurality of wiring layers laminated in a thickness direction, and a plurality of insulating layers interposed between the plurality of wiring layers in the thickness direction, and the air-core transformer is configured by a wiring pattern in the plurality of wiring layers.

Clause 19.

The control board according to clause 18, wherein the switching element is mounted on the wiring substrate.

What is claimed is:

1. A driving circuit for controlling driving of a switching element by outputting a driving signal to the switching element, comprising an air-core transformer having a plurality of primary windings and a secondary winding magnetically coupled to each of the plurality of primary windings, wherein an AC signal is input to each of the plurality of primary windings of the air-core transformer, the plurality of primary windings comprise a first primary winding and a second primary winding, and there is a phase difference between an AC signal input to the first primary winding and an AC signal input the second primary winding.

2. The driving circuit according to claim 1, wherein if a number of the primary windings is n (n is a natural number), phases of AC signals input to each of the n primary windings are different from one another by $2\pi/n$.

3. The driving circuit according to claim 2, wherein a number of the primary windings is an odd number.

4. The driving circuit according to claim 1, wherein an AC signal input to each of the plurality of primary windings is an AC voltage where a period to have a positive value and a period to have a negative value in one cycle are same to each other.

5. The driving circuit according to claim 1, wherein respective numbers of turns of the plurality of primary windings are same to one another.

6. The driving circuit according to claim 5, wherein respective numbers of turns of the plurality of primary windings and a number of turns of the secondary winding are same to one another.

7. The driving circuit according to claim 1, wherein the plurality of primary windings and the secondary winding are alternatingly wound.

8. The driving circuit according to claim 7, wherein each of the plurality of primary windings and the secondary winding are wound in a toroidal shape.

9. The driving circuit according to claim 8, wherein each of the plurality of primary windings comprises a plurality of primary side first circulation parts and a plurality of primary side second circulation parts, each primary side first circulation part being ring-like as seen in a toroidal direction, each primary side second circulation part being ring-like as seen in the toroidal direction, the secondary winding comprises a plurality of secondary side first circulation parts and a plurality of secondary side second circulation parts, each secondary side first circulation part being ring-like as seen in the toroidal direction, each secondary side second circulation part being ring-like as seen in the toroidal direction, the plurality of primary side first circulation parts of each of the plurality of primary windings and the plurality of secondary side first circulation parts are aligned in the toroidal direction and constitute a first cylindrical part, the plurality of primary side second circulation parts of each of the plurality of primary windings and the plurality of secondary side second circulation parts are aligned in the toroidal direction and constitute a second cylindrical part, and the second cylindrical part is located inside the first cylindrical part as seen in the toroidal direction.

10. The driving circuit according to claim 9, wherein as for the first cylindrical part, the primary side first circulation parts of each of the plurality of primary windings are respectively arranged adjacent to one another in the toroidal direction and constitute a plurality of primary side first circulation part groups, and the plurality of primary side first circulation groups and the plurality of secondary side first circulation parts are alternatingly aligned in the toroidal direction.

11. The driving circuit according to claim 10, wherein as for the second cylindrical part, the primary side second circulation parts of each of the plurality of primary windings are respectively arranged adjacent to one another in the toroidal direction and constitute a plurality of primary side second circulation part groups, and the plurality of primary side second circulation groups and the plurality of secondary side second circulation parts are alternatingly aligned in the toroidal direction.

12. The driving circuit according to claim 11, wherein each of the plurality of primary side first circulation part groups and each of the plurality of secondary side second circulation parts are overlapped with each other as seen in an axial direction in which a central axis of the toroidal direction extends, and each of the plurality of primary side second circulation part groups and each of the plurality of secondary side first circulation parts are overlapped with each other as seen in the axial direction.

13. The driving circuit according to claim 12, as for each of the plurality of primary windings, each of the plurality of primary side first circulation parts comprises a primary side first upper conductor part and a primary side first lower conductor part separated from each other in an axial direction in which a central axis of the toroidal direction extends, as for each of the plurality of primary windings, each of the plurality of primary side second circulation parts comprises a primary side second upper conductor part and a primary side second lower conductor part separated from each other in the axial direction, as for the secondary winding, each of the plurality of secondary side first circulation parts comprises a secondary side first upper conductor part and a secondary side first lower conductor part separated from each other in the axial direction, and as for the secondary winding, each of the plurality of secondary side second circulation parts comprises a secondary side second upper conductor part and a secondary side second lower conductor part separated from each other in the axial direction.

14. The driving circuit according to claim 13, wherein the primary side first upper conductor part and the primary side first lower conductor part in each of the plurality of primary windings and the secondary side first upper conductor part and the secondary side first lower conductor part in the secondary winding respectively have a band-like shape extending from an inner periphery of the first cylindrical part to its outer periphery, as seen in an axial direction in which a central axis of the toroidal direction extends.

15. The driving circuit according to claim 14, wherein the primary side first upper conductor part and the primary side first lower conductor part in each of the plurality of primary windings respectively have a size with respect to the toroidal direction smaller than those of the secondary side first upper conductor part and the secondary side first lower conductor part in the secondary winding, as seen in the axial direction.

16. The driving circuit according to claim 13, wherein the primary side second upper conductor part and the primary side second lower conductor part in each of the plurality of primary windings, and the secondary side second upper conductor part and the secondary side second lower conductor part in the secondary winding respectively have a band-like shape extending from an inner periphery of the second cylindrical part to its outer periphery, as seen in the axial direction.

17. The driving circuit according to claim 16, wherein the primary side second upper conductor part and the primary side second lower conductor part in each of the plurality of primary windings respectively have a size with respect to the toroidal direction smaller than those of the secondary side second upper conductor part and the secondary side second lower conductor part in the secondary winding, as seen in the axial direction.

18. A control board comprising the driving circuit according to claim 1, the control board comprising a wiring substrate carrying the air-core transformer inside, wherein the wiring substrate comprises a plurality of wiring layers laminated in a thickness direction, and a plurality of insulating layers interposed between the plurality of wiring layers in the thickness direction, and the air-core transformer is configured by a wiring pattern in the plurality of wiring layers.

19. The control board according to claim 18, wherein the switching element is mounted on the wiring substrate.

* * * * *